(12) United States Patent
Puhakka et al.

(10) Patent No.: US 7,872,237 B2
(45) Date of Patent: Jan. 18, 2011

(54) CIRCUIT SUBSTRATE AND METHOD

(75) Inventors: Kimmo Puhakka, Espro (FI); Iain Benson, Church Crookham (GB)

(73) Assignee: IPL Intellectual Property Licensing Limited, Limassol (CY)

( * ) Notice: Subject to any disclaimer, the term of this patent is extended or adjusted under 35 U.S.C. 154(b) by 846 days.

(21) Appl. No.: 10/532,119

(22) PCT Filed: Oct. 27, 2003
(Under 37 CFR 1.47)

(86) PCT No.: PCT/GB03/04635

§ 371 (c)(1),
(2), (4) Date: Jul. 23, 2007

(87) PCT Pub. No.: WO2004/038810

PCT Pub. Date: May 6, 2004

(65) Prior Publication Data

US 2008/0093560 A1    Apr. 24, 2008

(30) Foreign Application Priority Data

Oct. 25, 2002    (GB)    .................................. 0224902.7
Oct. 25, 2002    (GB)    .................................. 0224903.5

(51) Int. Cl.
*G01T 1/24*        (2006.01)
*H01L 21/00*       (2006.01)
(52) U.S. Cl. .............................. 250/370.08; 250/370.09; 250/370.11; 257/341; 257/435; 257/443; 257/448; 438/57; 438/67
(58) Field of Classification Search ............ 250/370.01, 250/370.08, 370.09, 370.13, 370.14; 257/431, 257/435, 443, 448
See application file for complete search history.

(56) References Cited

U.S. PATENT DOCUMENTS 4,106,046 A    8/1978    Nathanson et al.

(Continued)

FOREIGN PATENT DOCUMENTS

EP    0415541 A1    3/1991

(Continued)

*Primary Examiner*—David P Porta
*Assistant Examiner*—Casey Bryant
(74) *Attorney, Agent, or Firm*—Knobbe Martens Olson & Bear LLP

(57) ABSTRACT

Embodiments of the invention are concerned with semiconductor circuit substrates for use in a radiation detection device, said radiation detection device comprising a detector substrate having a plurality of detector cells arranged to generate charge in response to incident radiation, each of said detector cells including at least one detector cell contact for coupling charge from said detector cell to said semiconductor circuit substrate. More particularly, in embodiments of the invention the semiconductor circuit substrate comprises: a plurality of cell circuit contacts, each of which is configured to receive charge from a corresponding detector cell contact, cell circuitry associated with said plurality of cell circuit contacts; one or more conductive pathways arranged to carry at least one of control, readout and power supply signals to and/or from said cell circuitry; and one or more signal pathways extending through said semiconductor circuit substrate, said one or more signal pathways being electrically coupled to said conductive pathways so as to provide an external signal interface for said cell circuitry. Embodiments in accordance with the present invention thus provide a means of routing signals through the semiconductor circuit substrate to an electrical contact on a surface of the semiconductor circuit substrate. The electrical contact on the surface of the circuit substrate can then be directly coupled to a corresponding electrical contact on a mount.

10 Claims, 15 Drawing Sheets

U.S. PATENT DOCUMENTS

| | | | |
|---|---|---|---|
| 4,142,199 A | 2/1979 | Simi et al. | |
| 4,188,709 A | 2/1980 | Lorenze, Jr. et al. | |
| 4,239,312 A | 12/1980 | Myer et al. | |
| 4,257,057 A | 3/1981 | Cheung et al. | |
| 4,369,458 A | 1/1983 | Thomas et al. | |
| 4,513,312 A | 4/1985 | Takemura | |
| 4,602,289 A | 7/1986 | Sekine | |
| 4,609,823 A | 9/1986 | Berger et al. | |
| 4,694,316 A | 9/1987 | Chabbal | |
| 4,744,057 A | 5/1988 | Descure et al. | |
| 4,811,371 A | 3/1989 | Tower | |
| 4,817,123 A | 3/1989 | Sones | |
| 4,873,708 A | 10/1989 | Cusano et al. | |
| 4,900,943 A | 2/1990 | Marshall et al. | |
| 4,916,664 A | 4/1990 | Berger et al. | |
| 4,945,243 A | 7/1990 | Arques | |
| 4,947,258 A | 8/1990 | Hersh | |
| 4,992,878 A | 2/1991 | Hersh | |
| 5,012,247 A | 4/1991 | Dillman | |
| 5,043,582 A | 8/1991 | Cox et al. | |
| 5,081,346 A | 1/1992 | Narabu et al. | |
| 5,113,263 A | 5/1992 | Audaire et al. | |
| 5,149,954 A | 9/1992 | Pettijohn et al. | |
| 5,153,420 A | 10/1992 | Hack et al. | |
| 5,168,528 A | 12/1992 | Field, Jr. | |
| 5,182,624 A | 1/1993 | Tran et al. | |
| 5,245,191 A | 9/1993 | Barber et al. | |
| 5,291,402 A | 3/1994 | Pfoh | |
| 5,315,114 A | 5/1994 | Kansy et al. | |
| 5,315,147 A | 5/1994 | Soloman | |
| 5,315,411 A | 5/1994 | Blanding | |
| 5,379,336 A | 1/1995 | Kramer et al. | |
| 5,401,952 A | 3/1995 | Sugawa | |
| 5,402,168 A | 3/1995 | Fouilloy | |
| 5,475,212 A | 12/1995 | Nelson et al. | |
| 5,526,394 A | 6/1996 | Siczek et al. | |
| 5,587,738 A | 12/1996 | Shinohara | |
| 5,596,200 A | 1/1997 | Sharma et al. | |
| 5,742,058 A | 4/1998 | Pantigny et al. | |
| 5,812,191 A | 9/1998 | Orava et al. | |
| 5,917,881 A | 6/1999 | Jeffery | |
| 5,937,326 A * | 8/1999 | Cho | 438/669 |
| 5,998,777 A | 12/1999 | Audier et al. | |
| 6,014,313 A | 1/2000 | Hesselbom | |
| 6,035,013 A | 3/2000 | Orava et al. | |
| 6,188,089 B1 | 2/2001 | Spartiotis | |
| 6,248,990 B1 | 6/2001 | Pyythia et al. | |
| 6,262,421 B1 | 7/2001 | Tran | |
| 6,278,181 B1 | 8/2001 | Maley | |
| 6,459,077 B1 | 10/2002 | Hynecek | |
| 6,563,539 B1 | 5/2003 | Lefevre | |
| 6,645,787 B2 * | 11/2003 | Nemirovsky et al. | 438/56 |
| 6,952,042 B2 * | 10/2005 | Stratton et al. | 257/418 |
| 2002/0036269 A1* | 3/2002 | Shahar et al. | 250/370.1 |
| 2002/0130266 A1* | 9/2002 | Kyyhkynen | 250/370.09 |
| 2002/0180063 A1* | 12/2002 | Iwaki et al. | 257/778 |
| 2003/0155516 A1* | 8/2003 | Spartiotis et al. | 250/370.09 |
| 2004/0069213 A1 | 4/2004 | Bourgoin | |
| 2006/0046340 A1* | 3/2006 | Murakami et al. | 438/68 |
| 2006/0255419 A1* | 11/2006 | Lai et al. | 257/433 |
| 2009/0014826 A1* | 1/2009 | Chien et al. | 257/433 |

FOREIGN PATENT DOCUMENTS

| | | |
|---|---|---|
| EP | 0 556 820 A1 | 2/1993 |
| EP | 0635892 A1 | 1/1995 |
| EP | 0660600 B1 | 3/1999 |
| EP | 1001469 A2 | 5/2000 |
| EP | 1063709 A2 | 12/2000 |
| EP | 1176814 A2 | 1/2002 |
| GB | 2318411 A1 | 4/1998 |
| GB | 2323736 A1 | 9/1998 |
| GB | 2343577 A1 | 5/2000 |
| JP | 01200720 | 8/1989 |
| JP | 2002311146 | 10/2002 |
| WO | WO 98/16853 A1 | 4/1998 |
| WO | WO 01/01486 A1 | 1/2001 |
| WO | WO 01/08224 A1 | 2/2001 |

* cited by examiner

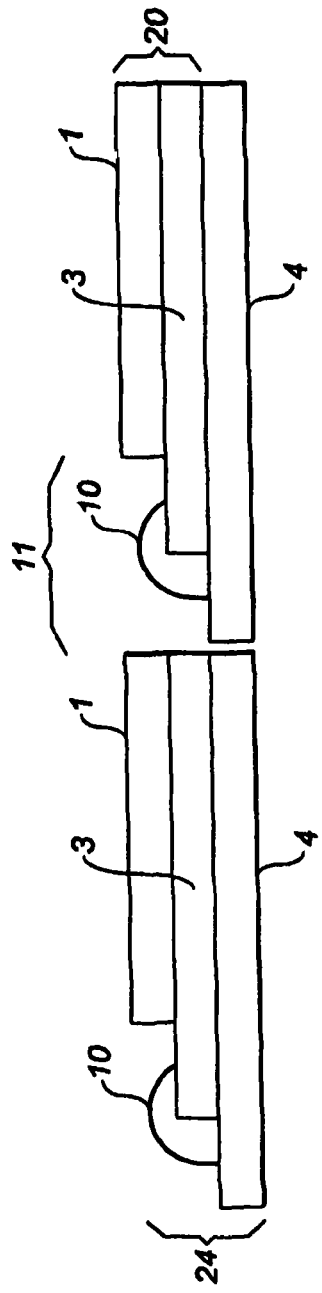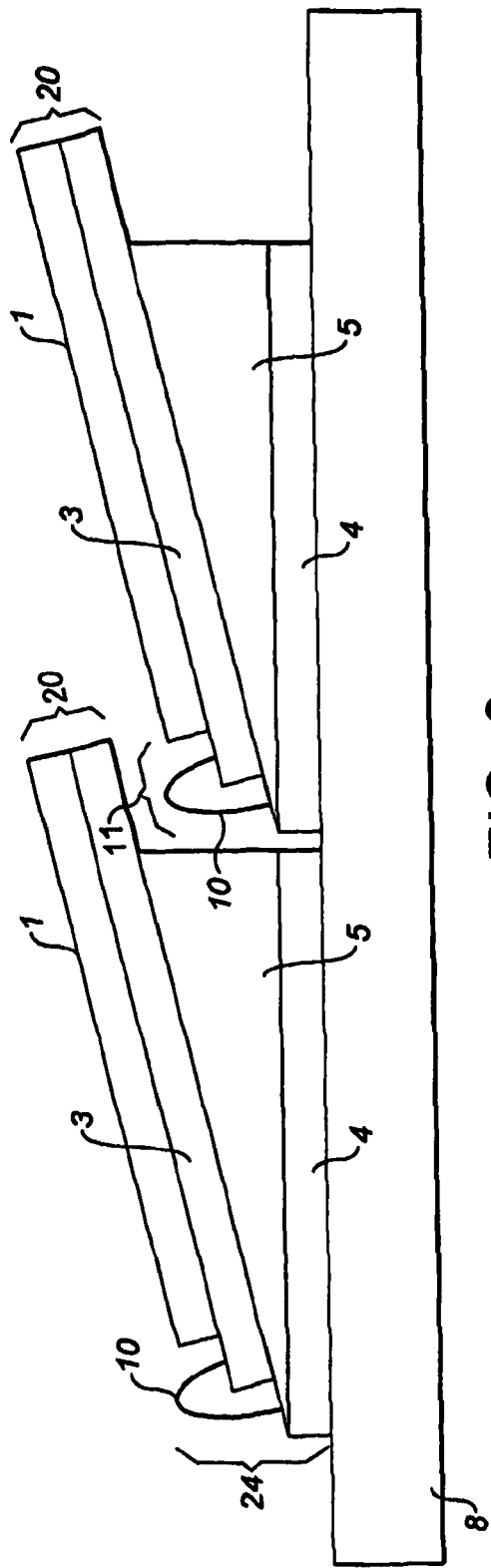

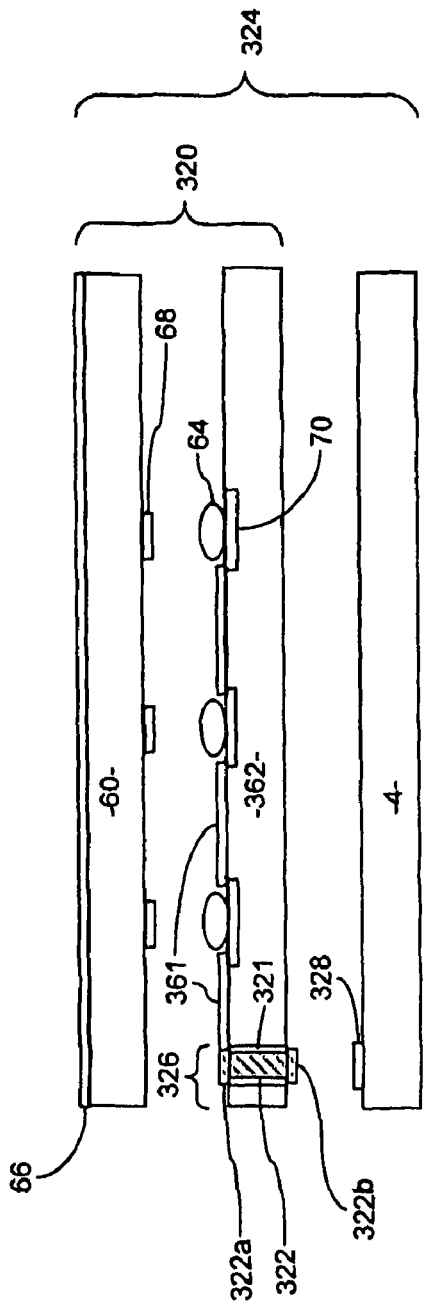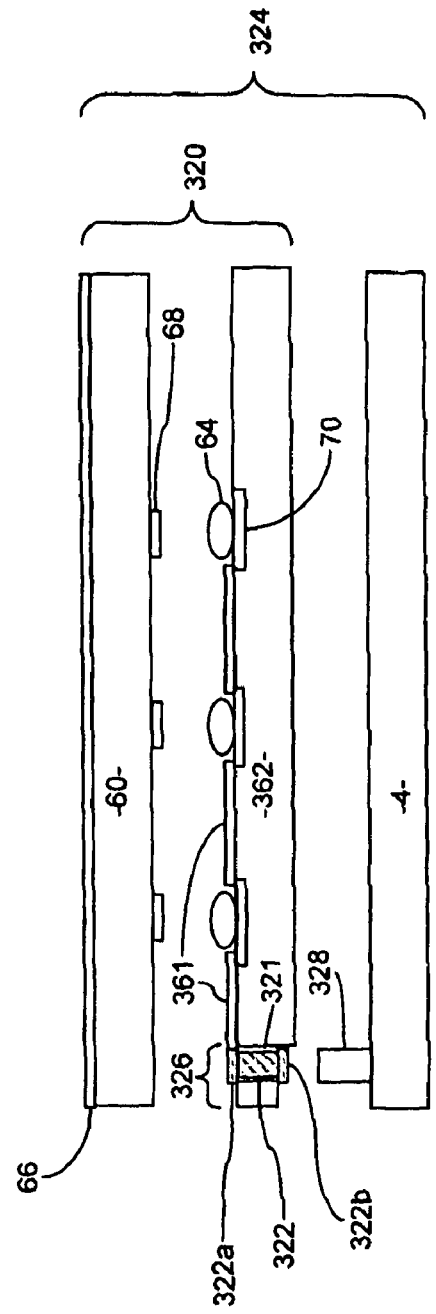

CIRCUIT SUBSTRATE AND METHOD

This is a 371 national phase application of PCT/GB2003/004635 filled 27 Oct. 2003, claiming priority to GB Application No. 0224903.5 and GB Application No. 0224902.7, both filed 25 Oct. 2002, the contents of which are incorporated herein by reference.

FIELD OF THE INVENTION

This invention relates to a circuit substrate, and has particular relevance to a circuit substrate for an imaging device for imaging radiation, where the imaging device comprises an array of image cells.

BACKGROUND OF THE INVENTION

There are several different types of imaging devices, including: charged coupled image sensors (also known as charged coupled devices (CCDs)); semiconductor pixel detectors, which comprise a semiconductor substrate with electrodes arranged to apply depletion voltage to each pixel position and define a charge collection volume; and Active-pixel Semiconductor Imaging Devices (ASID), which comprise an array of pixel or image cells including a semiconductor substrate having an array of pixel detectors (detector cells) and a further array of pixel circuits (cell circuits). An ASID type of device is described in International patent application PCT/EP95/02056 (publication number WO95/33332). As described in WO95/33332, detector cells are arranged to generate charge in response to incident radiation, and are associated with a cell circuit, which is arranged to accumulate charge resulting from radiation incident on the detector cell. The cell circuits are individually addressable and comprise circuitry which enables charge to be accumulated from a plurality of successive radiation hits on an associated detector cell. Optionally, charge may be read out directly or individual radiation photon hits may be counted by incorporating suitable counter circuitry in the cell circuits. At a determined time, the charge or count can be read out from the cell circuit and used to generate an image based on the analogue charge or count values read from each of the cell circuits. The term "read out circuit" may also be used herein to refer to a cell circuit.

An example of an ASID is illustrated in FIG. 1. A detector layer 1 having a large number of detector cells formed in it is mounted on a circuit layer 3, which comprises a circuit chip and is formed of a semiconductor substrate having cell circuits corresponding to the detector cells formed in detector layer 1. Circuit chip 3 and detector layer 1 form an imaging device 20, and the circuit chip 3 is coupled to a mount 4, to which external interface bond wires 10 from circuit chip 3 are coupled. The bond wires 10 take signals collected from detector layer 1 by circuit chip 3 and route them to connections on mount 4. Imaging device 20 and mount 4 together form an imaging device tile 24.

Typically, the imaging surface area of device 20 is of the order of one square millimetre to several square centimetres, and, if a large imaging area is required then a plurality of tiles needs to be placed next to each other to form a large area imaging system. Due to the space taken up by the bond wires 10 there is "dead" imaging space 11 in between adjacent imaging device tiles 24. Such regions of "dead" space 11 can result in incomplete images being generated, and/or the missing data having to be compensated for, or extrapolated from the image data that was collected.

One way of addressing the problem of "dead" spaces between adjacent imaging tiles is disclosed in International Patent Application Publication No. WO98/03011, corresponding to U.S. Ser. No. 08/899,936, incorporated herein by reference. FIG. 2 schematically illustrates the arrangement disclosed in WO 98/03011. Each imaging device tile 24 includes a support 5 for the imaging device which is thus tilted such that "dead" space 11 of an adjacent tile fits under the imaging device tile 24 thereby forming a substantially continuous imaging surface. A tiled array of imaging device tiles 24 are supported with edge to edge contact on a suitable support structure 8 to form a large area substantially continuous imaging surface. A drawback of a tilted tile configuration is that the arrangement for tilting the tiles is relatively complex and involves more parts and components than would be necessary if the imaging devices 20 could be laid flat. Additionally, the imaging surface is not in a single plane which can give rise to image aberrations and artefacts. In particular, if support structure 8 is kept flat and substantially perpendicular to the direction of incident radiation, then the radiation is incident at an angle to the imaging surface thereby inducing image aberration and artefacts, and reducing image resolution due to radiation being incident on more than one detector cell as it passes through the tilted detector layer 1.

Another configuration for a tiled array of imaging device tiles 24 is disclosed in the above-mentioned international patent application (International Publication No. WO95/33332). WO95/33332 discloses an array of tiled imaging devices in which adjacent columns (a, b) of tiles are offset in a columnar direction, such as illustrated in FIG. 3. As can be seen, "dead" space 11 of tile 24 in column (a) corresponds to an imaging surface of a tile 24 in column (b). During an imaging operation, the arrangement in FIG. 3 is stepped relative to the object to be imaged in a direction transverse, preferably substantially orthogonal, to the columnar direction of the tile array. By stepping the arrangement of FIG. 3 in a transverse direction, during an image exposure, "dead" spaces 11 may be compensated for and substantially eliminated. However, such an arrangement requires a stepper mechanism for relative movement and image processing circuitry and appropriate software for processing the resultant multi exposure image. Such imaging device tile systems are complex and run the risk of mechanical failure.

A further drawback of known configurations for imaging device tiles 24 is that the detector layer 1 is mechanically and electrically coupled to the circuit layer 3 by low-temperature bump bonds. Each detector cell is coupled to a corresponding circuit cell by means of a bump bond, and consequently there is a high density array of bump bonds (e.g. in this technology the order of bump bonds per square mm is generally in the range 4 to 40K bump bonds per square mm). The following table shows spatial bump bond densities for various devices.

TABLE 1

| Pixel Size - side dimensions of square in microns | Bump Bond Density in bumps per square mm. |
| --- | --- |
| 500 - Gamma Camera | 4 |
| 100 - Panoramic & Real-time Cassette | 100 |
| 35 - High Resolution Silicon Sensor | 900 |
| 10 - tested in laboratory | 10,000 |
| 5 - technology road map | 40,000 |

It is extremely difficult to ensure and maintain consistent bump bond quality, particularly since the bump bonds cannot be inspected. These difficulties have a significant impact on the quality and manufacturing yield of imaging devices and imaging device tiles.

The present invention is made with the foregoing considerations in mind.

SUMMARY OF THE INVENTION

According to a first aspect of the invention there is provided a semiconductor circuit substrate for use in a radiation detection device, said radiation detection device comprising a detector substrate having a plurality of detector cells arranged to generate charge in response to incident radiation, each of said detector cells including at least one detector cell contact for coupling charge from said detector cell to said semiconductor circuit substrate, the semiconductor circuit substrate comprising:

a plurality of cell circuit contacts, each of which is configured to receive charge from a corresponding detector cell contact, cell circuitry associated with said plurality of cell circuit contacts;

one or more conductive pathways arranged to carry at least one of control, readout and power supply signals to and/or from said cell circuitry; and one or more signal pathways extending through said semiconductor circuit substrate, said one or more signal pathways being electrically coupled to said conductive pathways so as to provide an external signal interface for said cell circuitry.

Embodiments in accordance with the present invention obviate the need to couple control, readout and power supply signals from the semiconductor circuit substrate (also referred to herein as circuit substrate) to a mount, such as a printed circuit board, with bond wires, since the signal pathways route the signals through the circuit substrate to an electrical contact on a surface of the semiconductor circuit substrate. The electrical contact on the surface of the circuit substrate may then be directly coupled to a corresponding electrical contact on the mount. This is more reliable and robust than wire bonding the circuit substrate to the mount, and removes a cause of the "dead space" which arises between known imaging device tiles if tiled together to provide a flat large area image surface. Thus for example, large numbers of imaging device tiles having a circuit substrate in accordance with the invention can abut one other so as to provide a substantially continuous, yet flat, large area image surface.

Preferably the one or more signal pathways comprise a via hole containing conductive material, either substantially filling the via hole or coating the walls of the via hole, and the conductive material can be a metallic material, in particular a metal or a stack of layers of metals and/or metal alloys. More particularly the conductive material can be a low impedance conductive material, which provides a relatively low loss and low noise transmission medium for the control, readout and power supply signals.

In at least one arrangement the semiconductor circuit substrate comprises a first region and a second region, the first region having a first thickness and the second region having a second thickness, where the first thickness is generally greater than said second thickness. The semiconductor circuit substrate is arranged such that the signal pathways extend through said second region, which is conveniently located adjacent an edge of said circuit substrate.

The semiconductor circuit substrate comprises a first surface and a second surface, the first surface being disposed opposite said second surface and being proximate to the detector substrate. Cell circuit contacts can be disposed either on the first surface, in which case cell circuitry can either be formed in a region of said first surface, or the second surface, in which case cell circuitry can be formed in a region of the second surface. When the cell circuitry is disposed on the first surface, connection of the circuit substrate with the detector substrate, via the cell circuitry becomes easy. When the cell circuitry is disposed on the second surface, the circuitry is protected from radiation incident upon the detector substrate by the thickness of the circuit substrate; in this latter arrangement, the cell circuitry can be fabricated inside the circuit substrate.

According to a second aspect of the invention there is provided a method for fabricating a semiconductor circuit substrate for use in a radiation detection device, comprising the steps of:

(a) forming one or more via holes through a semiconductor circuit substrate so as to form one or more signal pathways, the or each signal pathway having a first end and a second end;

(b) depositing conductive material in said one or more signal pathways to provide one or more conductive signal pathways therein;

(c) connecting at least one of control signal, readout and power supply lines to the first end of said signal pathways; and (d) connecting cell circuitry to the second end of said signal pathways.

In one arrangement, the method includes reducing the thickness of said semiconductor circuit substrate in a region of the substrate, and forming said via holes through the region. By reducing the depth of the circuit substrate in the region through which the signal pathways extend relative to the rest of the substrate, the aspect, or step, ratio of the via hole can be controlled. If a substrate is too thick to etch, then it can be thinned prior to etching the via holes; this avoids fabricating circuit substrates that have very wide via holes at one end (which would result in reduced useful circuit area).

Preferably said cell circuitry is fabricated in said semiconductor circuit substrate prior to reducing the thickness of said semiconductor circuit substrate, and step (b) comprises inserting conductive material into said one or more via holes.

Conductive shielding, coupled to a reference potential such as ground for example, may be formed around a substantial part of said one or more signal pathways in order to shield the signal pathways from noise, such as "shot noise" from incident radiation, and cross-talk between adjacent signal pathways. Preferably, forming the shielding comprises, prior to depositing the conductive material in the via holes, depositing a conductive shielding over internal walls of said one or more via holes; and depositing an insulating layer over said conductive shielding.

Preferably the step of forming one or more via holes through a semiconductor circuit substrate comprises the steps of:

depositing photo-resistive material over said circuit substrate;

applying a photo-lithographic mask having one or more openings corresponding in said region;

exposing said photo-resistive material through said openings in said mask;

removing said exposed photo-resistive material to expose said circuit substrate; and etching said exposed circuit substrate to etch said one or more via holes through said substrate.

Suitable etch techniques are well known to the skilled person and include chemical etching, and plasma etching.

In another aspect of the invention a radiation detection device is provided which includes a semiconductor circuit substrate as described above, and a detector substrate including a detector cell responsive to incident radiation to generate charge. The detector cell includes at least one detector cell contact for coupling charge from the detector cell to the cell circuit, and the detector substrate can be mechanically coupled to said circuit substrate by an array of said signal pathways. This detection device may be used as a simple radiation detector, or as the radiation detection element in a "Geiger counter".

The cell circuitry can be of any suitable type for implementing different radiation detection or imaging device applications. For example the circuitry may include one or more of the following: charge accumulation circuitry; counter circuitry; read out circuitry; energy discriminator circuitry; pulse shaping circuitry; pulse amplifying circuitry; analogue to digital converter circuitry; and rate divider circuitry.

In one arrangement, the detector cell contacts are disposed on a first surface of said detector substrate, and the detector substrate has a bias contact on a surface opposing said first surface of the detector substrate. Conveniently the bias contact is arranged to co-operate with said detector cell contact so as to define a detector cell, and can extend substantially continuously across said surface opposing said first surface of the detector substrate.

According to a further aspect of the present invention there is provided a method for fabricating a semiconductor imaging device for imaging radiation, the method comprising the steps of:
  etching an array of via holes through a circuit substrate at locations associated with an array of detector cell circuit locations;
  placing a detector substrate having an array of detector cell contacts corresponding to said array of cell circuit locations in proximal relationship to the etched circuit substrate such that detector contacts are in correspondence with said via holes; and
  depositing a conductive material in said via holes to provide signal pathways between said cell circuit locations and said detector cell contacts.

In one arrangement, an adhesive material is selectively applied to one or both of said detector substrate and said circuit substrate; and said detector substrate is coupled to said circuit substrate by means of said adhesive material. Preferably the layer of adhesive material is selectively applied to as to leave said detector contacts substantially uncovered by said adhesive, and can comprise photo-resistive material.

Particular embodiments include a radiation detection device tile, comprising:
  a radiation detection device such as described above; and
  a mount for mounting the detection device, wherein the mount includes electrical contacts for conductively coupling the signal pathways to corresponding external signal lines disposed on the mount.

Utilising various embodiments in accordance with the invention a radiation imaging cassette may be formed, comprising a housing, and a plurality of radiation detection device tiles as described above. The radiation detection device tiles may be mounted and arranged to form a large area imaging tiled array. A radiation cassette as just described is a suitable plug-in replacement for a conventional film cassette. Thus, solid state digital imaging may be provided for legacy imaging systems, hitherto operable for film only. This removes the need for re-engineering of existing systems to fit semiconductor based digital imaging systems, and also reduces the need to replace such systems due to obsolescence as they can be relatively easily updated for digital imaging by using a radiation imaging cassette in accordance with the invention, and connecting it to a suitable image processing apparatus such as a computer.

BRIEF DESCRIPTION OF THE DRAWINGS

Illustrative embodiments of the present invention will now be described, hereinafter by way of example only, with reference to the accompanying drawings in which like numerals refer to like elements, and in which:

FIG. 1 is a schematic illustration of known imaging device tiles;

FIG. 2 is a schematic illustration of known imaging device tiles tilted to provide a substantially continuous imaging surface;

FIG. 5 is a schematic illustration of one embodiment of the invention using conductive via holes;

FIG. 6 is a schematic illustration of another embodiment of the invention using conductive via holes;

DETAILED DESCRIPTION OF THE DRAWINGS

Figure 3:
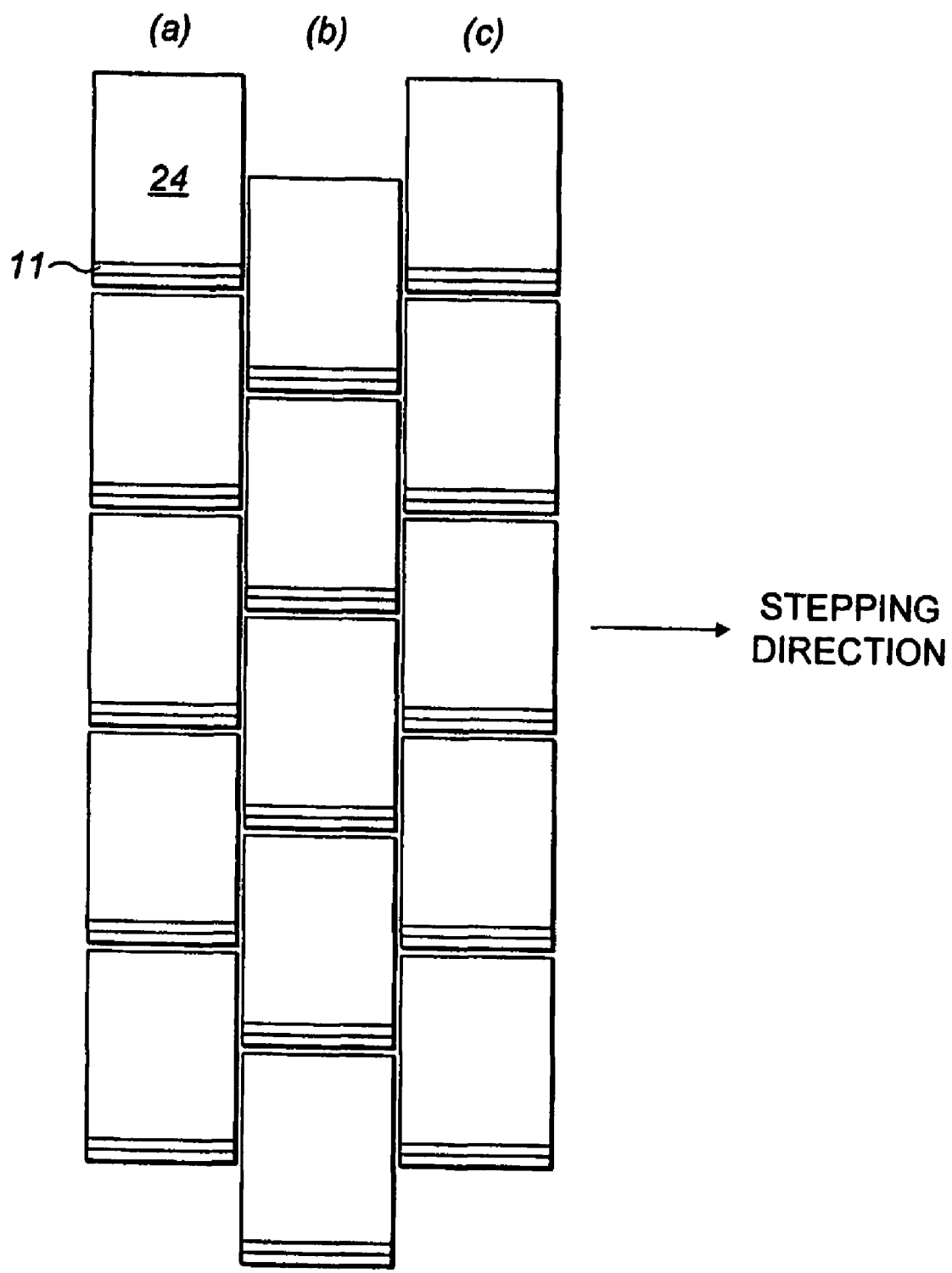
FIG. 3 schematically illustrates a known configuration of an array of imaging device tiles having columns offset in a columnar direction.
Figure 4:
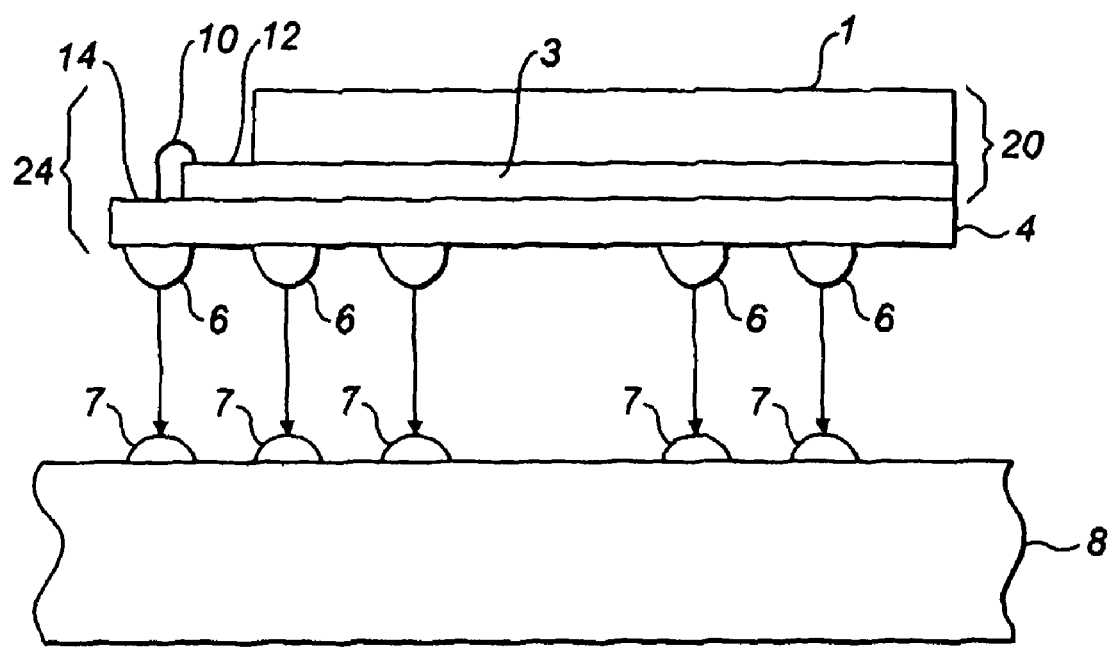
FIG. 4 is a schematic illustration of the bump-bond connections for a known imaging device mounted to an imaging support.

Referring to FIG. 4, it can be seen that conventional imaging device 20 has two steps towards its left-hand edge: a first step 12 between the detector 1 and the readout chip 3; and a second step 14 between the readout chip 3 and the mount 4. As described in the background section, the purpose of these steps is to enable bond wires 10 to make a connection between contact pads on the readout chip 3 and respective contact pads on the mount 4, thereby providing for the external electrical interface of the readout chip 3 to the metal bumps 6 mentioned previously. In the readout chip 3, all internal electrical connections are brought to a single end of the chip to facilitate this connection and also to reduce the amount of dead imaging area for a mosaic of imaging device tiles. Each imaging device 20 needs several (around 5 to 15) external lines for carrying control signals, supply voltage and readout signals generated in response to incident radiation. These lines are provided on the PCB 4 and also, for example, on a circuit board 8 on which the imaging device tile 24 may be mounted. The imaging device tile 24 itself carries a number of contacts 6 in the form of, for example, small metal spheres or bumps, and the number of contacts typically corresponds to the number of external lines. The metal bumps 6 match an equal number of small appropriately sized contacts 7 on the circuit board 8 of the imaging support, and the contacts 7 are connected to the aforementioned control, supply and signal lines (not shown).

As also described in the background section, it will be appreciated that when the imaging devices tiles are arranged side-by-side and end-to-end, dead spaces occur (i.e. areas over which the detector does not extend) at the stepped region described above. Also, in conventional tiled arrays, spaces occur between adjacent imaging devices arranged side-by-side because the supports are wider than the detector surfaces. As described above, approaches to dealing with this problem involve staggering adjacent rows of imaging devices on an imaging array and then providing for relative movement between an object to be imaged and the imaging array. This means that the effect of the dead spaces can be at least substantially eliminated, but this does require the provision of the mechanism for the relative movement and appropriate software for processing the resultant multi-exposure image. Another approach to dealing with this problem is to modify the structure of the individual tiles to enable adjacent tiles to be mounted very close to or even touching each other. The tile structure is arranged such that the imaging device is tilted with respect to the mount 4 and/or the support plane 8. This means that a portion of the imaging device 20 may be arranged to overlap the dead space of an adjacent imaging device tile in order to provide a substantially continuous imaging surface, such as illustrated in FIG. 2.

Generally speaking, embodiments of the present invention utilise an electrically conductive signal pathway between surfaces of the circuit substrate, to make electrical connections between the circuit substrate and mount 4 without bond wires, thereby avoiding "dead" imaging space of the ends of an imaging device. The conductive signal pathway is made by etching a hole (via hole) through the circuit substrate between the surfaces of the substrate, and either coating the surface of the hole with electrically conductive material, or providing an electrically conductive in-fill for the holes.

FIG. 5 illustrates a first embodiment in accordance with one aspect of the invention, comprising an imaging device 320 formed of a detector substrate 60 having a detector cell contact 68 flip chip bonded to a cell circuit substrate 362 (the flip chip bond is shown in exploded form for clarity). The detector substrate 60 is flip chip-bonded to the circuit substrate 362 via bump bonds 64 which are built on circuit contacts of cell circuits 70. Whilst in FIG. 5 the control signal, readout signal and supply voltage lines 361 for the circuit substrate 362 are arranged so that they terminate in a region at one end, 326, of the circuit substrate 362, they could alternatively be located at any region within the circuit substrate.

A series of via holes 321 forming signal pathways are etched through the circuit substrate 362 in the region 326 so as to provide a conduit between respective surfaces of substrate 362. Contact pads 322a and 322b may be formed on respective surfaces of the circuit substrate 362 and coupled together via a conductive infill 322 such as gold, thereby providing a low impedance conductive pathway between respective surfaces of substrate 362. Other suitable conductive materials may be used such as silver, copper, aluminium, tungsten and TiN. Typically, the contact pads 322a and 322b are formed at the same time as forming conductive infill 322, by using the same process step. Contact pad 322a is connected to a control, signal and/or supply voltage line for the cell circuit 70, while contact pad 322b is formed to provide a suitable contact point to electrically couple to contact 328 of mount 4. As an alternative to providing the conductive signal pathway by filling the via hole 321, the walls of the via hole can be coated with a conductive material.

The use of conductive via holes in circuit substrate 362 removes the need for bond wires between the circuit substrate 362 and mount 4, which means that ends of the detector substrate 60, the circuit substrate 362 and the mount 4 can lie along the same line. A device tile 324 comprising such a detector substrate 60, circuit substrate 362 and mount 4 can then be placed and butted directly against an adjacent similar imaging device tile, thereby achieving a substantially flat and continuous imaging surface, and removing the need for tilting the imaging device tiles.

The width to depth ratio (aspect, or step, ratio) is an important parameter for the via holes, since it determines the ease with which the via holes may be through plated or filled with conductive material. Additionally, the step ratio determines the diameter of the via hole at one of the surfaces, which, if too large, would take up too much of the surface area of the corresponding circuit substrate 362 or mount 4 to be useful. The limit on how thin a circuit substrate may be is determined by the depth to which circuits extend into the substrate. The step ratio of via holes etched through circuit substrates such as silicon (Si), or Gallium Arsenide (GaAs), Sapphire, and other Ill-V class substrates are such that for a circuit substrate thickness of 50 to 300 microns the diameter of the via hole at one surface will be of the order 30 microns for a diameter of 20 microns at the opposite surface; in general a width to depth (aspect) ratio of about 5:1 is used.

In some cases, typically when the circuit substrate 363 is "thinned" (either locally in the region 326 or along the entire substrate), the step ratio is such that efficient utilisation of the mount 4 or circuit substrate surfaces is not possible. In such cases the mount 4 can include an upstanding mount contact 328 in order to compensate for the thinned region of circuit substrate 362, as shown in FIG. 6, and the contact 328 can be profiled so as to electrically couple with contact 322b of circuit substrate 362.

In a preferred embodiment of the invention, circuit substrate 362 is thinned prior to having via holes etched through it, but it can be thinned after etching. Cell circuits 70 are formed on circuit substrate 362 either before or after forming via holes, or thinning and via hole etching of the circuit substrate. When thinning is performed after etching it is not necessary for the hole to penetrate the whole of the substrate, since the thinning process can remove any unetched layer (thereby exposing the hole).

Figure 7:
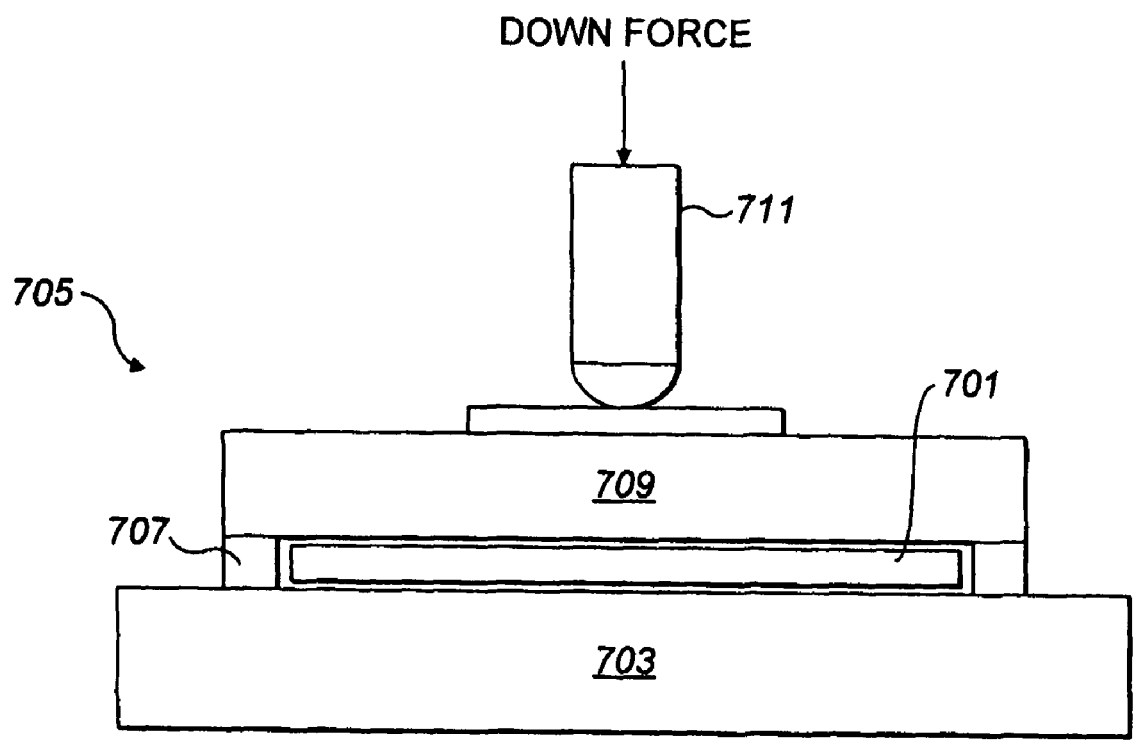
FIG. 7 schematically illustrates an arrangement for "thinning" a CMOS circuit substrate.

An example of a method of fabricating an imaging device in accordance with an embodiment of the present invention will now be described with reference to FIGS. 7 and 8A-8G. Turning firstly to FIG. 7, an arrangement for "thinning" a silicon wafer 701 prior to etching is shown, in which the wafer 701 is mechanically lapped to a thickness of approximately 100 to 150 microns by standard backgrind or Chemical Mechanical Polishing (CMP) process, both of which involve a rotating platen having suitable abrasiveness to provide a polishing pad 703. The wafer 701 can be either a substantially unprocessed "raw" wafer, typically 6 inches diameter and having a number of circuit substrate "chips" fabricated on it. The polishing particle size is of the order 35 of microns. The wafer 701 is held in a rotating chuck assembly 705 comprising a retaining ring 707 for fixing the wafer in the chuck assembly 705, and a carrier member 709 for supporting the retaining ring 707. The carrier member 709 is attached to a spindle 711, which is arranged to apply a rotating motion to the chuck assembly 705 and can be moved back and forth across the polishing pad 703. An abrasive slurry can be introduced between the polishing pad 703 and wafer 701 for assisting in and lubricating the mechanical grinding process, and a down force is applied via spindle 711 to hold the wafer 701 against polishing pad 703. Instead of rotating both the wafer and the polishing pad, one or other of the wafer or polishing pad can be rotated (whilst the other part remains stationary), or the polishing pad can be moved, back and forth.

Figure 8A:
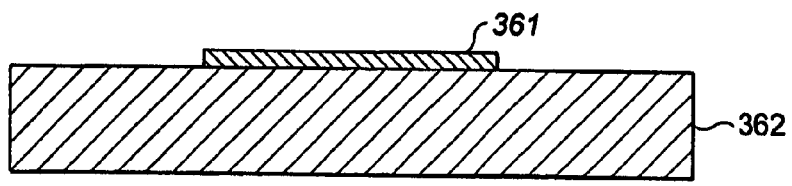
FIGS. 8A-8G are schematic diagrams showing various stages involved in forming a circuit substrate in accordance with an embodiment of the invention.
Figure 8B:
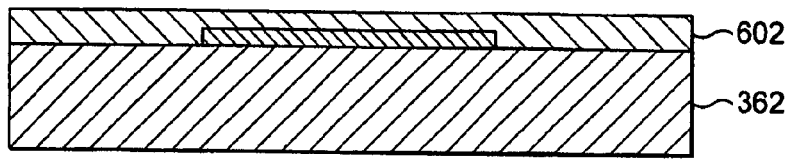
Figure 8C:
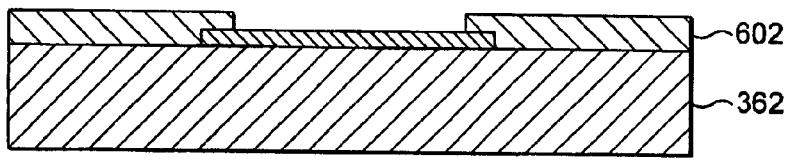

Turning now to FIGS. 8A-8G, a process for fabricating an imaging device having conductive via holes for providing an external interface to a circuit substrate will now be described. Although only one conductive via hole and signal line is illustrated, it will be evident that the process may be applied for a plurality of conductive via holes and signal lines. FIG. 8A illustrates a part of a thinned "CMOS" circuit substrate 362 including a control signal, readout signal or voltage supply line 361. As shown in FIG. 8B, photo-resist 602 is deposited over the CMOS circuit substrate, including the supply line 361. The photo-resist 602 is then exposed through a suitable photo-lithographic mask to leave an area of the supply line 361 uncovered (FIG. 8C). For a via hole in a 150-micron thick circuit substrate, the photo-resist 602 is typically exposed to leave 30-micron holes through the supply line 361, thereby yielding through holes having substantially clear, straight sidewalls. The via holes can be circular, oval, be in the form of a square or rectangle, and have straight or bevelled sides.

Figure 8D:
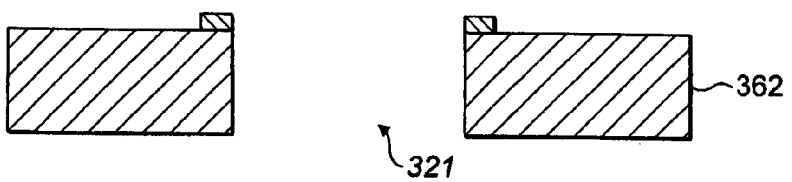
Figure 8E:
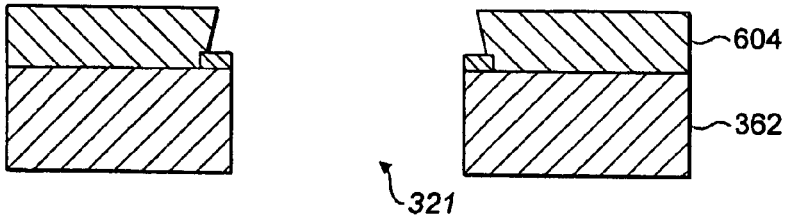
Figure 8F:
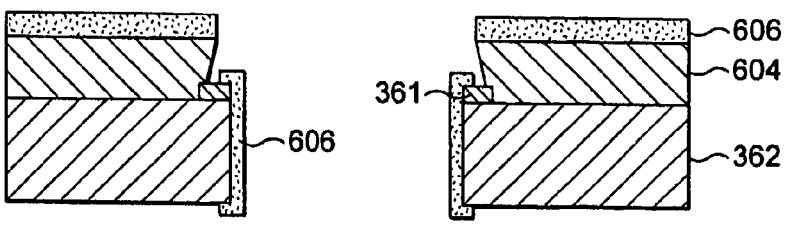
Figure 8G:
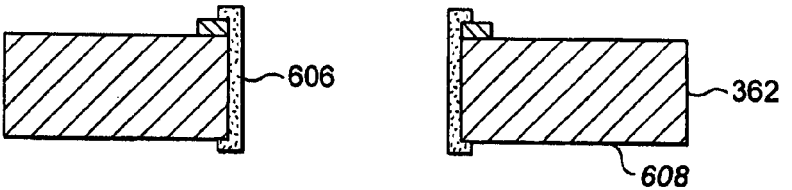

The circuit substrate 362 is then etched through the exposed regions of the photo-resist 602, for example using a typical industry standard process such as a $SF_6\backslash O_2\backslash HBr$ type process, to produce via hole 321 in the circuit substrate 362 (FIG. 8D). The photo resist is then removed from the circuit substrate, and a new photo resist layer 604 is deposited over the circuit substrate, including the side walls of the via hole 321 (not shown in a separate figure). Subsequently, a mask is placed over photo resist 604, and the photo resist exposed to leave the region corresponding to the via hole 321 (including the side walls) uncovered, as illustrated in FIG. 8E. Gold 606 is then deposited over the circuit substrate, more specifically on the remainder of the supply line 361 and along the side walls of the via hole 321 to the lower surface 608 of the circuit substrate, thereby providing electrical coupling between the supply line 361 and the lower surface of the circuit substrate. The gold 606 can be deposited via any suitable means such as sputtering, electrical chemical deposition, E-Less, or Electro-Less or Electric-less chemical deposition. The photo-resist 604 is subsequently removed, thereby removing any excess gold, as illustrated in FIG. 8G. In the particular arrangement illustrated in FIG. 8G the side walls of the through via hole 321 are coated with conductive material.

A problem with using thinned circuit substrates to manufacture bump bonded imaging devices is that thinned substrates are considerably weaker than non-thinned substrates, and are prone to cracking or even breaking during bump bonding to a detector substrate 60. Thus in a further aspect of the invention, mechanical connection between the detector and circuit substrates is achieved without bump bonding, as will now be described.

Figure 9:
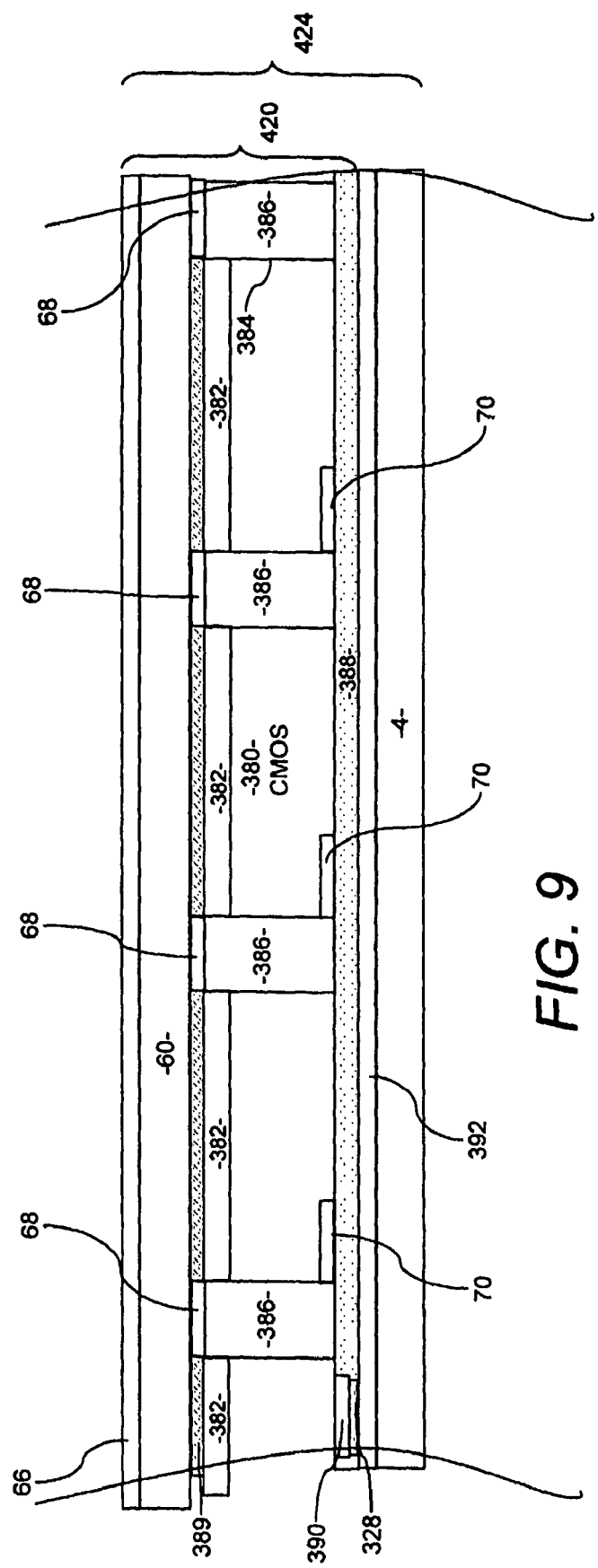
FIG. 9 is a schematic diagram showing an imaging device using conductive via holes to couple a detector substrate to a circuit substrate.

The basic arrangement of an imaging device and imaging device tile configured in accordance with this further aspect is illustrated in FIG. 9. The arrangement includes a detector substrate 60 having a continuous bias electrode 66 on one surface, and detector cell contacts 68 formed on another surface to define detector cells. The detector substrate 60 is mechanically coupled to the circuit substrate 380 by way of an adhesive material 382, which can be photo-resist, adhesive or epoxy, and patterned so as to leave the regions corresponding to detector cell contact 68 exposed. Via holes 384 are etched through the circuit substrate 380 and filled with conductive material 386 according to the method described above, at locations corresponding to detector cell contacts 68. The cell circuits 70 are located adjacent each via hole 384 on a surface opposing that to which the adhesive material 382 has been applied. Preferably, circuit substrate 380 has been thinned so that the via hole step ratio is not too large.

Having filled the via hole 384 (or simply coated the walls, as per FIG. 8F) with conductive material 386, this conductive material 386 is connected to associated cell circuit 70 so as to provide a pathway for charge collected at detector contact 68 to flow to the cell circuit 70. Control and readout signal lines and supply voltage lines are coupled from the cell circuits 70 to a circuit substrate contact pad 390, which provides electrical coupling to a mount contact pad 328 on the mount 4. An epitaxial layer 388 is deposited over the lower surface of the circuit substrate to protect the cell circuit 70 and conductive material 386, and to electrically insulate it. The imaging device 420, formed of detector substrate 60 and circuit substrate 380, is coupled to the mount 4 by way of a suitable adhesive material 392, thereby forming an imaging device tile 424.

Since the cell circuits 70 are formed adjacent the lower surface of the circuit substrate 380, the control and readout signal lines and voltage supply lines can run along the lower surface and therefore the circuit substrate contact pad 390 can also be on a lower surface. Thus, in comparison to conventional methods, there is therefore no need to run bond wires from the top surface, (i.e. the surface closest to the detector substrate) of circuit substrate 380 to a contact pad on mount 4, which as disclosed in previous devices requires the mount 4, circuit substrate 380 and detector substrate 60 to be stepped resulting in "dead" spaces.

From a comparison of the arrangements shown in FIGS. 5 and 6 and that shown in FIG. 9, it can be seen that the cell circuitry 70 is further away from a point at which radiation is incident upon the device tile 424 than it is when the substrates are connected by bump bonds. As a result, any radiation incident upon the device tile 424 has further to travel before reaching the circuitry, and the substrates 60, 380 provide protection of the cell circuitry 70, thereby effectively improving the radiation hardness of the cell circuit 70.

Since bonding of the detector substrate to the circuit substrate has been achieved without bump-bonding, the chances of a thinned circuit substrate cracking during fabrication of an imaging device are reduced.

Figure 10:
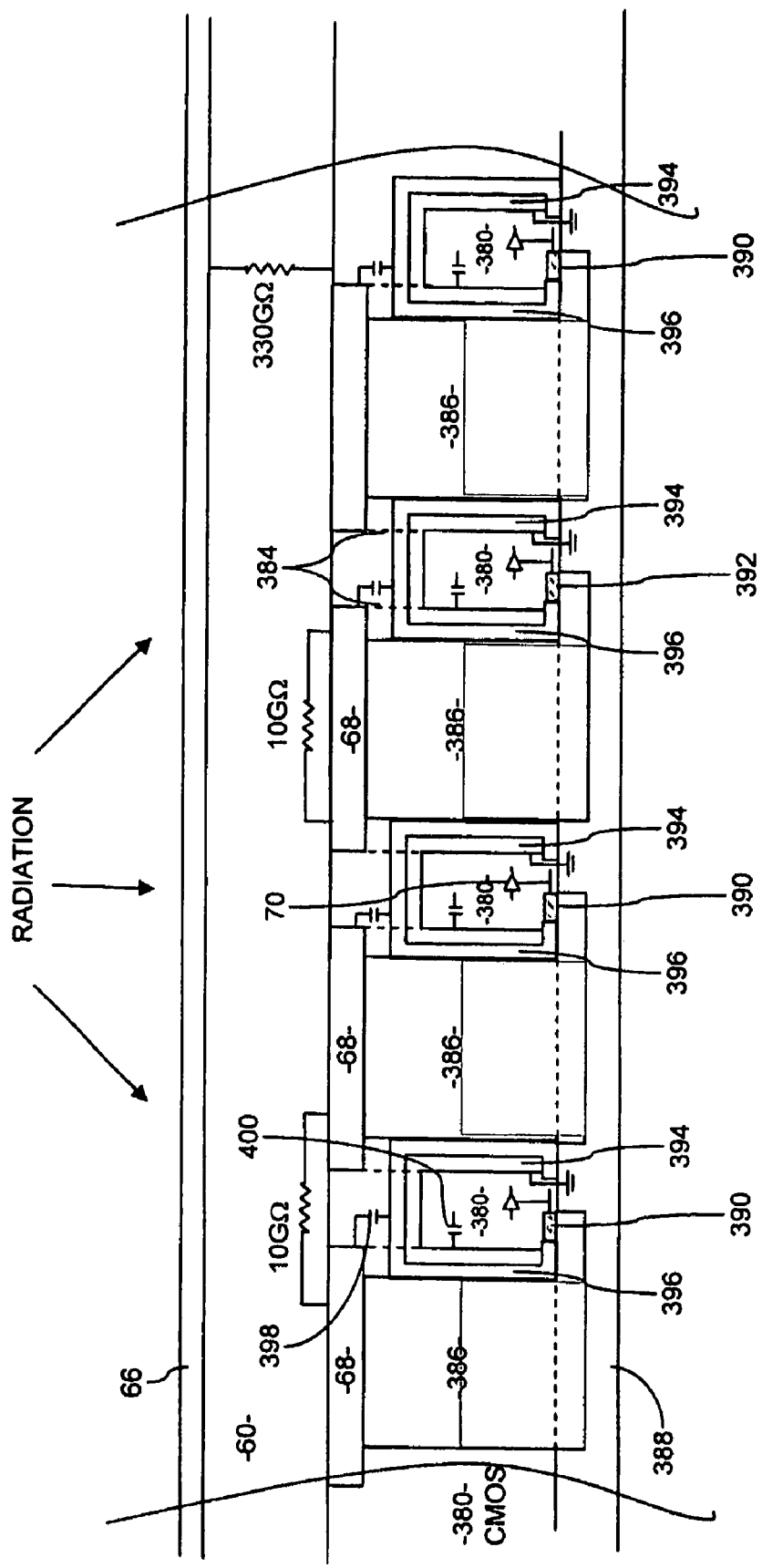
FIG. 10 is a detailed schematic illustration of the arrangement shown in FIG. 9.

FIG. 10 schematically illustrates a cross section through conductive via holes of an imaging device according to the arrangement described with respect to FIG. 9. As described above with reference to FIG. 9, detector substrate 60 has a bias contact 66 disposed on an upper, or radiation facing, surface of the detector substrate 60, and the lower surface of the detector substrate 60 comprises an array of detector contacts 68. The resistance between the bias contact 66 and detector contact 68 is of the order 330 GΩ, and the inter-detector cell contact resistance is of the order 10 GΩ.

To manufacture imaging devices as shown in FIGS. 9 and 10, via holes 384 are etched through the circuit substrate 380 in accordance with steps 8A-8D. It should be noted that in FIG. 10, the extents of the holes after step 8D are shown in dotted lines. Next, a conductive shielding layer 394, typically of aluminium but which may be of any suitable conductive material, is deposited over the surfaces of the circuit substrate 380, including the walls of the via holes 384. A lower surface of the circuit substrate 380 has suitable gaps in the conductive shielding 394 for the circuit cell circuits 70 and corresponding cell circuit contacts 390, and, as can be seen in FIG. 10, the cell circuitry is located inside the circuit substrate 380. The conductive shielding 394 is coupled to a reference potential, typically ground. A layer of insulating material, 396, such as silicon oxide and typically of the order of five microns thick, is then deposited over the conductive shielding layer 394, and an epitaxial layer 388, for example $SiO_2$, is applied to the lower surface of the circuit substrate 380 to protect the cell circuitry surface and connections. The conductive material 386 is then inserted into the holes 384, so that the conductive material 386 is adjacent to the layer 396 of insulating material. A passivation layer (layer 389 shown in FIG. 9) can be deposited between detector contacts 68 in order to increase intercontact resistivity, and preferably, the passivation layer is aluminium nitride.

In the arrangement shown in FIG. 10, a parasitic capacitance 398 exists between detector cell contact 68 and the insulating layer 396 and a further parasitic capacitance 400 exists between shielding 394 and the bulk detector substrate material 380 in the CMOS cell circuit region. Parasitic capacitances are generally considered undesirable since they tend to reduce detector charge collection efficiency, limit maximum operating speed, can introduce "cross-talk" between adjacent cell circuits, increase readout signal noise and interconnect signal path impedance. However, in the present embodiments the benefits associated with locating the cell circuitry 70 inside the substrate (e.g. improved radiation hardness) offset these drawbacks. In preferred arrangements, the circuit substrate material 380 is supplied as a wafer, or a die thereof, which is approximately 600 microns thick, and is thinned to a thickness of the order of 100 microns thick. It will be appreciated that thinning a circuit substrate, as described above with reference to FIG. 7, reduces the parasitic capacitance between the detector substrate and circuit substrate, so that these inherent parasitic capacitances 398, 400 will be minimised, leading to a faster transfer of charge from the detector substrate to the cell circuitry 70.

When high energy radiation passes through detector substrate 60 and is transmitted to the circuit substrate material 380, electron-hole pairs are generated, presenting a source of noise in an imaging device. In order to maximise the strength of signal associated with the incident radiation, it is, however, desirable to select a material for detector substrate 60 that optimises the number of electron-hole pairs (of the order of 20,000 electron whole pairs). There is therefore a trade off between strength of signal and noise, and, when the cell circuitry 70 is located inside the circuit substrate 380, it is desirable if the circuit substrate material can produce substantially fewer electron-hole pairs. For a typical circuit substrate detector material having 600-micron thickness, something of the order of 10,000 electron-hole pairs are generated due to incident high-energy radiation. However, this can be reduced to around the order of 2000 of less electron-hole pairs when the circuit substrate material 380 is thinned to a thickness of around 100 microns. Therefore, thinned circuit substrate material advantageously reduces radiation-induced noise in cell circuits.

Having been thinned (e.g. using the apparatus shown in FIG. 7), the circuit substrate wafer 701 is then etched in a Plasma Enhanced Reactive Ion Etch (PERIE) or Inductive Coupled Plasma (ICP) type etcher and the silicon etched through at respective detector cell contact regions corresponding to a circuit contact for the detector substrate circuitry. Typically, the cell circuitry is CMOS circuitry, but other circuitry may be used.

For completeness, fabrication of an imaging device having detector cell contact pads electrically coupled to associated cell circuits will now be described with reference to FIGS. 11A-11H. These Figures show the steps involved in fabricating an imaging device 420 shown in FIGS. 9 and 10 and FIGS. 11A-11D are essentially equivalent to FIGS. 8A-8D (described above), but with one important difference. In FIGS. 11A-11D, via hole 384 is etched through contact pad 390, whereas in FIGS. 8A-8D, via hole 321 was shown being etched through circuitry 361. Contact pad 390 is positioned on an opposite surface of the circuit substrate 380 to that on which circuitry 361 is located, because, in this aspect of the invention, there is no need for an electrical connection on the surface of the circuit substrate nearest the detector cell contacts 68 (because detector substrate 60 is not bonded to the circuit substrate 380 by bump bonds). As a result, circuitry 361 is effectively replaced by contact pad 390, positioned on an opposite surface of the imaging device 320, as shown in FIGS. 9 and 10.

FIGS. 11E-11H show additional steps involved in bonding the detector substrate 60 to the circuit substrate 380. It should be noted that FIGS. 11A-11H show the detector and circuit substrates inverted, i.e. with the detector substrate underneath the circuit substrate, and thus effectively show the imaging device upside down compared to their orientation shown in FIGS. 5 and 6.

Figure 11A:
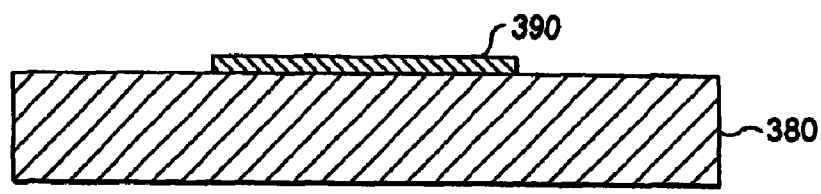
FIGS. 11A-11H are a series of drawings showing various stages involved in forming an imaging device substantially as illustrated in FIGS. 9 and 10.
Figure 11B:
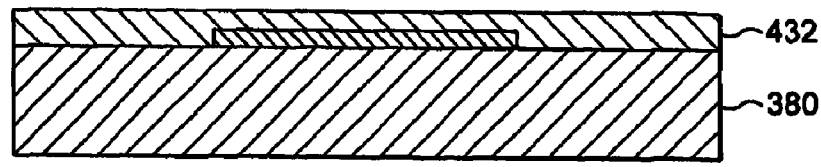
Figure 11C:
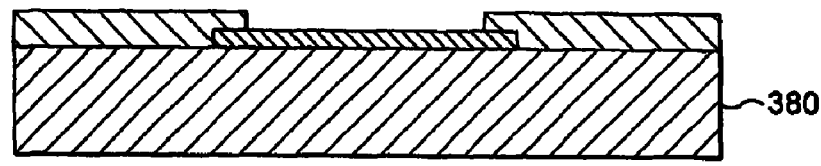
Figure 11D:
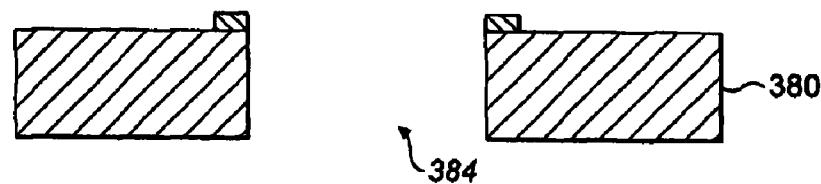

FIG. 11A illustrates a part of a CMOS circuit substrate 380 including a circuit contact pad 390. As shown in FIG. 11B, a layer of photo-resist 432 is deposited over the CMOS circuit substrate, including the circuit contact pad 390. The photo-resist 432 is then exposed through a suitable photo-lithographic mask to leave an area of the circuit contact pad 390 uncovered as illustrated in FIG. 11C. Typically, the photo-resist 432 is exposed to leave 30-micron holes over the circuit contact pads 390 (for a 150-micron thick circuit substrate). The circuit substrate 380 is then etched through the exposed regions of the photo-resist 390, for example using a typical industry standard process such as a $SF_6\backslash O_2\backslash HBr$ type process, to produce via hole 384 in the circuit substrate 380, as illustrated in FIG. 11D. The photo resist is then removed from the circuit substrate.

Figure 11E:
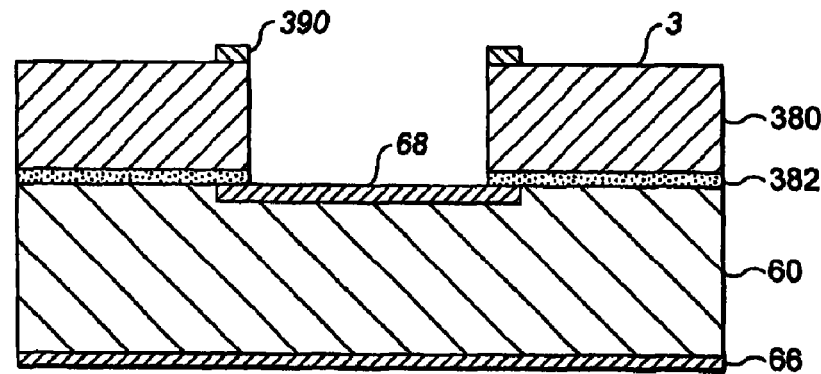

As shown in FIG. 11E, the circuit substrate CMOS 380 is attached to a detector substrate 60 such that the through holes 384 line up with the detector substrate contact pads 68. The CMOS circuit substrate 380 is attached to detector substrate 60 by any suitable adhesive material 382, such as photo-resist, which can be applied to one or other surface of the CMOS circuitry substrate 380 and detector substrate 60 and then exposed once the substrates have been attached together in order to uncover detector contact pads 68. Alternatively, an adhesive layer may be applied to one or other of the substrate surfaces, leaving the detector contact pad 68 uncovered.

Figure 11F:
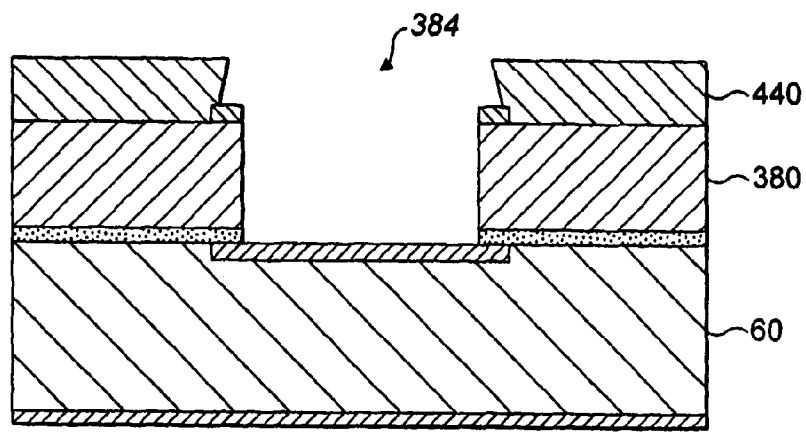
Figure 11G:
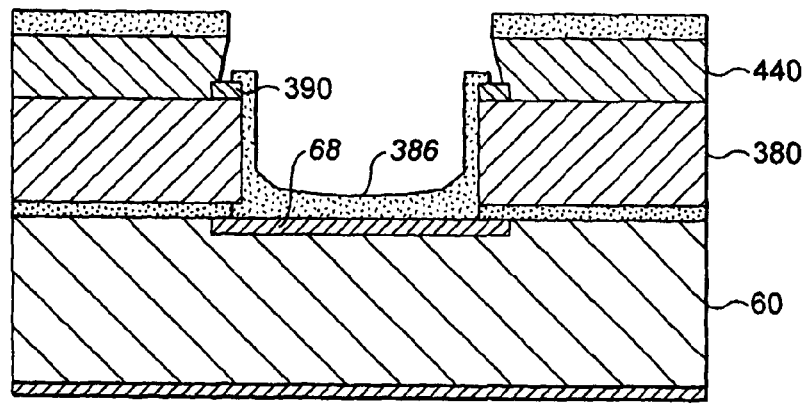
Figure 11H:
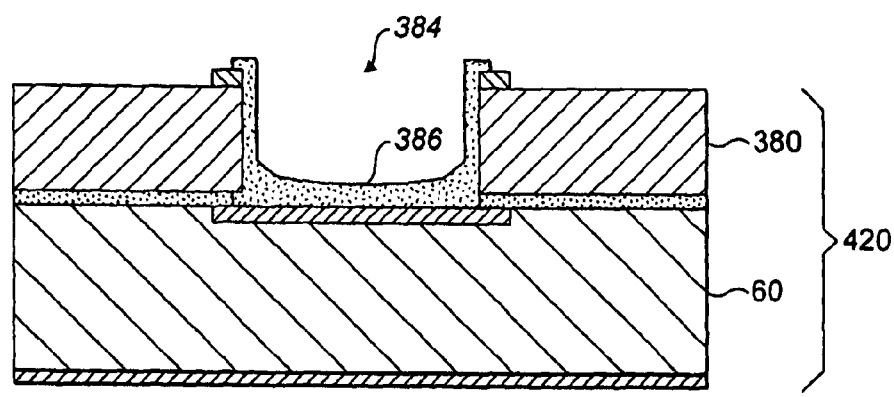

As shown in FIG. 11F, a photo resist layer 440 is deposited over the circuit and detector substrate assembly, and a mask is placed over photo resist 440, which is exposed to leave the region corresponding to the via hole 384 uncovered. In the next step, gold 386 is deposited over the substrate assembly (FIG. 11G), on the detector contact pad 68, along the walls of the via hole 384, and onto circuit contact pad 390 so as to provide electrical coupling between circuit contact pad 390 and detector contact pad 68. Gold may be deposited via any suitable means, such as sputtering, electrical chemical deposition, E-Less, or Electro-Less or Electric-less chemical deposition.

The photo-resist 440 is subsequently removed, thereby removing the excess gold (FIG. 11H), and leaving the CMOS circuit substrate 380 electrically coupled to the detector substrate 60 via a conductive through via hole 384. In the particular arrangement illustrated in FIG. 11H the side walls of the through hole 384 are coated with conductive material, but, as described above, gold could be deposited in the step shown in FIG. 11G to create a more solid in-fill of via hole 384.

Figure 12:
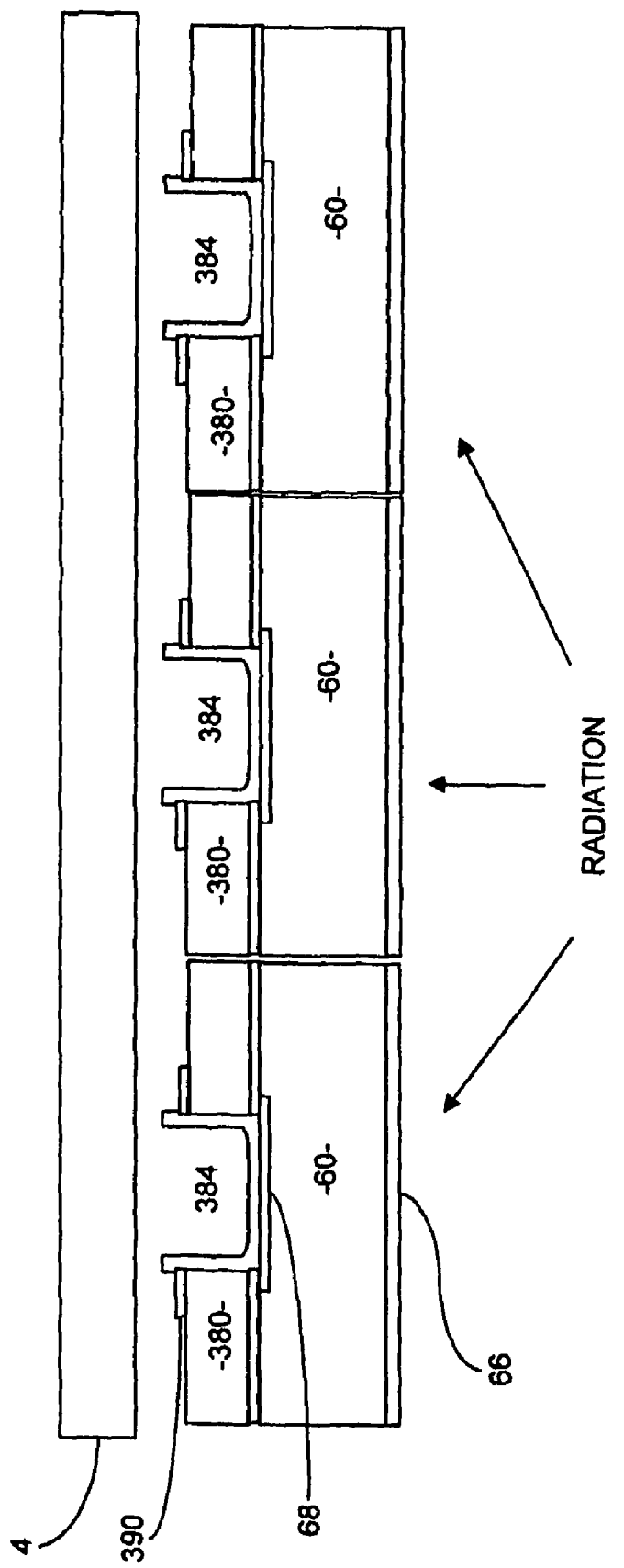
FIG. 12 is a schematic diagram showing a plurality of imaging devices substantially as illustrated in FIGS. 9 and 10 placed "end-to-end" in a tiled arrangement.

FIG. 12 illustrates an arrangement in which, by placing the metal contacts on the underside of the CMOS circuit substrate 380 configured in accordance with FIGS. 9 and 10, the imaging device output signals may be wire-bond coupled to a mounting PCB 4. Other suitable bond connections may be made, for example ball-grid-arrays (BGA), conductive epoxy and stud-bumps. In this way, a totally flat detector surface may be built to any size comprising large flat panels without any need to tilt adjacent imaging devices as is necessary in prior art arrangements.

Figure 13:
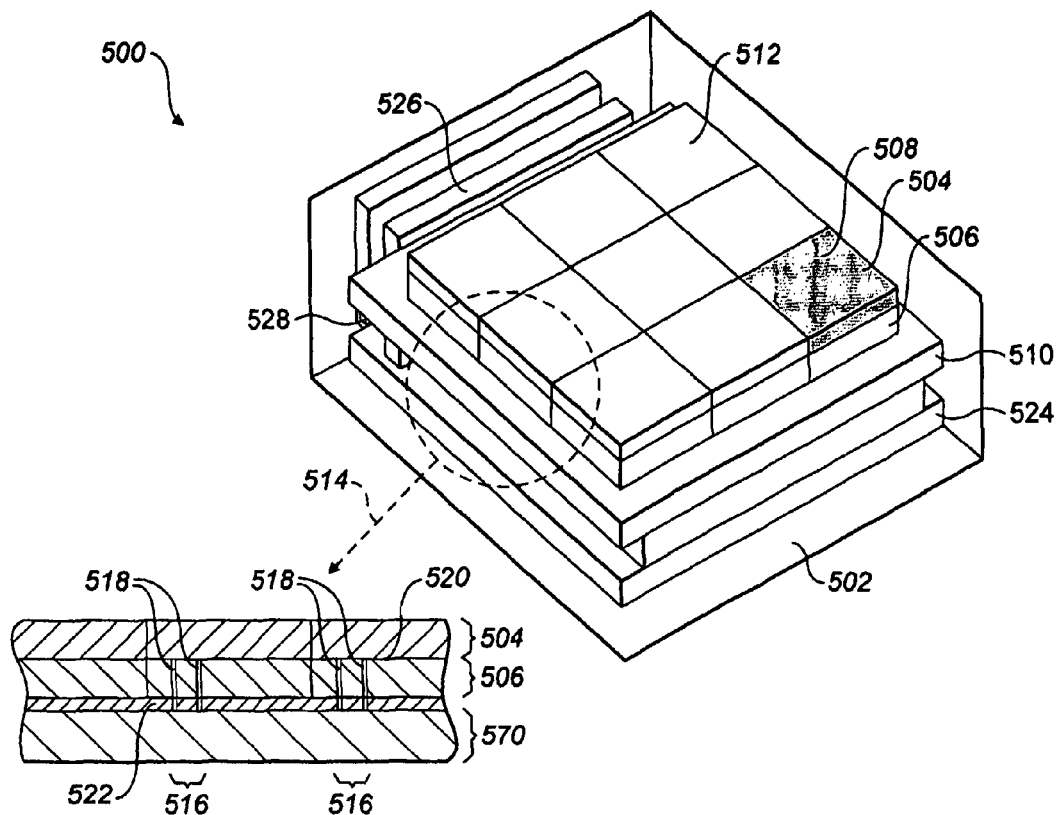
FIG. 13 is a schematic diagram showing a radiation imaging cassette utilising a 3×3 array of imaging devices in accordance with an embodiment of the present invention.

FIG. 13 illustrates a radiation imaging cassette 500, incorporating imaging devices and imaging device tiles in accordance with embodiments of the present invention. The cassette 500 is configured to be a plug-in replacement for conventional film cassettes in imaging systems, and its dimensions are accordingly dependent on the system for which the cassette is to provide the plug-in replacement.

The cassette 500 has a housing 502 in which are supported a 3×3 array of imaging devices having a separate detector substrate 504 and CMOS circuit substrate 506. The CMOS circuit substrate 506 may be thinned in accordance with one embodiment of the invention. Each imaging device may be supported on a separate mount (not shown) to form an imaging device tile 508. The imaging device tiles 508 are mounted on an analogue printed circuit board (PCB) 510 in an edge-to-edge configuration thereby providing a flat mounted continuous large area imaging surface 512. Analogue PCB 510 preferably comprises at least all the analogue electronics for the imaging device tiles 508 supported thereon, including control, readout and power supply signals.

A side cut-out view is shown as detail 514, and illustrates how the imaging devices may be place edge-to edge. The region 516 of each imaging device is shown having two rows of via holes 518 extending from the upper layer 520 of the CMOS circuit substrate 506, to the lower layer 522.

The analogue PCB 510 is connected to a digital motherboard 524 by way of a mother/daughter board connector 526. Input/output control, readout and power supply signals are also coupled to the analogue circuitry module by means of connector 526. The digital motherboard 524 comprises the digital electronics for controlling imaging acquisition and read-out and resetting of the imaging device tiles. Other circuitry, such as further analogue circuitry, may be disposed on circuit board 524. Digital motherboard has an input/output connector 528 for interfacing the imaging cassette 500 with the rest of an imaging system.

Figure 14:
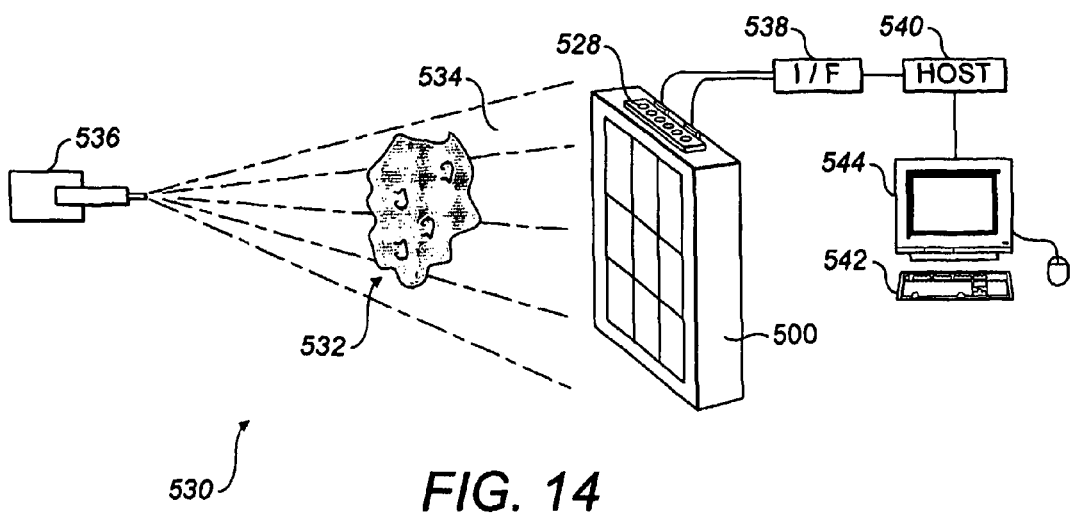
FIG. 14 is a schematic diagram showing an imaging system utilising a radiation imaging cassette as illustrated in FIG. 13.

Referring now to FIG. 14, there is schematically illustrated a radiation imaging system 530 including an imaging cassette 500 as described above. An object 532, for example in vivo or in vitro human tissue, is irradiated with X-rays 534 from a source 536. The object 532 may be stationary or moving relative to imaging cassette 500. Image signals are readout from the imaging cassette 500 via I/O connector 528 over a high speed (e.g. video data rate) readout interface 538 to a host controller 540. Image processing is then carried out on computer system 542, having a display 544 for displaying the image.

Further Details of Imaging Devices 20, 320, 420

Figure 15:
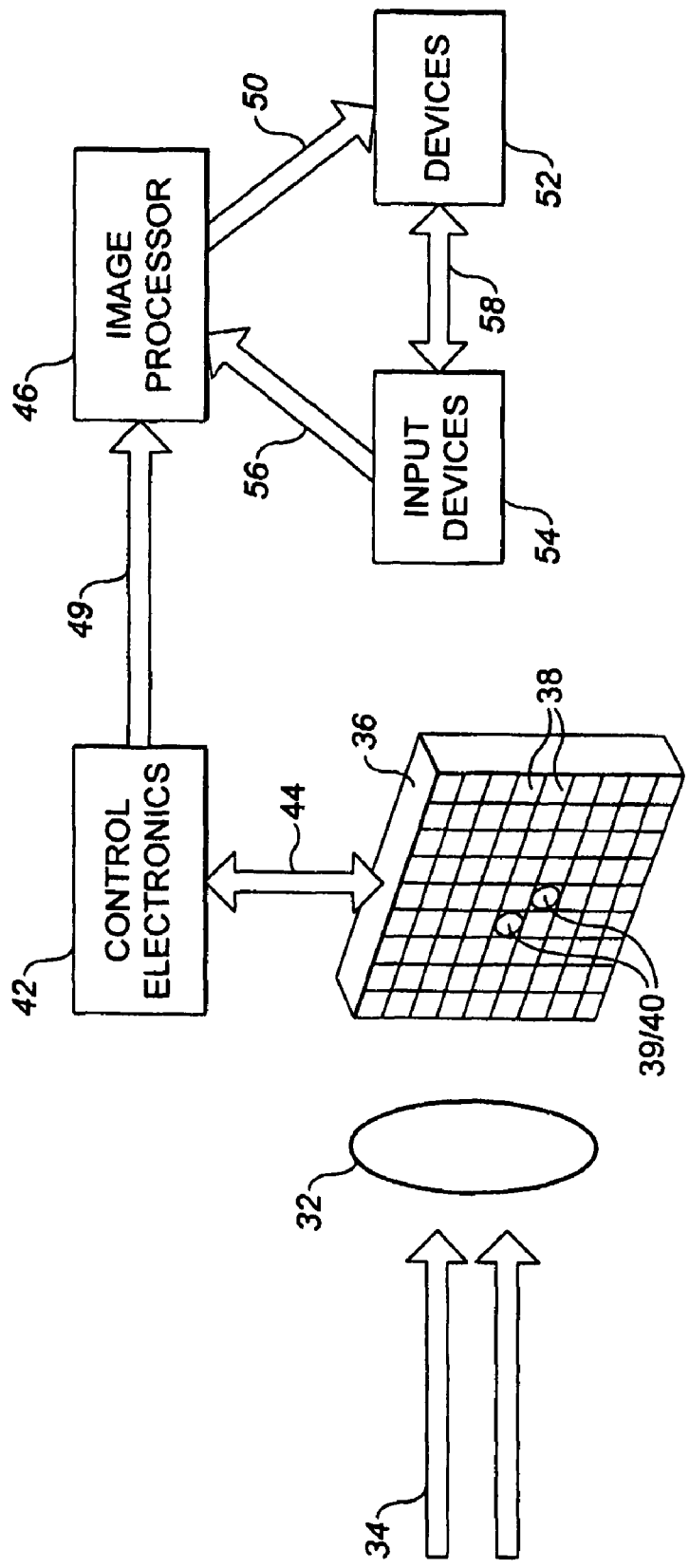
FIG. 15 schematically illustrates an imaging system using an imaging device in accordance with an embodiment of the present invention.

FIG. 15 is a schematic block diagram of one example of an imaging system using an imaging device in accordance with the present invention. This particular embodiment is directed to the imaging of high energy radiation, for example X-ray radiation. By high energy radiation is meant radiation having an energy in excess of approximately 1 KeV. However, the invention is by no means limited to high energy radiation such as X-rays but could be applied to the detection of any particular radiation, for example γ-ray, β-ray, α-ray, infra-red or optical radiation, subject to an appropriate choice of semiconductor detector substrate.

The imaging system 30 of FIG. 15 is shown to provide imaging of an object 32 subject to radiation 34. In this example the radiation may, for example, be X-ray radiation as mentioned above, but could optionally be γ-ray, β-ray, or α-ray radiation for example. The object 32 may, for example, be part of a human body. The imaging device 36 comprises plurality of image cells (here image cells 38 of a two dimensional image cell array). In the following, reference will be made to image cells in a two dimensional array although it will be appreciated that in other embodiments the individual image cells may have a configuration other than within a two dimensional array (e.g. a strip arrangement).

The imaging device directly detects high energy incident radiation and accumulates at each image cell, a charge corresponding to, or count of, the incident radiation hits at that image cell. The imaging device 36 is configured on two substrates, one with an array of detector cells 39 and one with an array of corresponding cell circuits 40, the substrates being mechanically connected to each in accordance with an embodiment of the invention.

Control electronics 42 provides control signals to, and readouts image signals from, the imaging device 36 over bus 48, and outputs an image over bus 50 to a display device such as a cathode ray tube or LCD display 52. Image processor 46 and display device 52 are controlled by input devices 54 such as a keyboard or pointing device (mouse) by way of control signals over buses 56 and 58 respectively.

The imaging system 30 may have many applications, including but not limited to the following examples: X-ray mammography; intra-oral X-ray imaging; panoramic oral X-ray imaging; computerised axial tomography (CAT); PET scanning; autoradiography; high speed real-time fluoroscopy; Gamma camera imaging; security baggage screening; spectroscopic imaging; X-ray diffraction crystallography; and non-destructive inspection.

Although only one imaging device 36 is shown, it will be appreciated that more than one imaging device may be utilised for example configured as an array of imaging device tiles.

Figure 16:
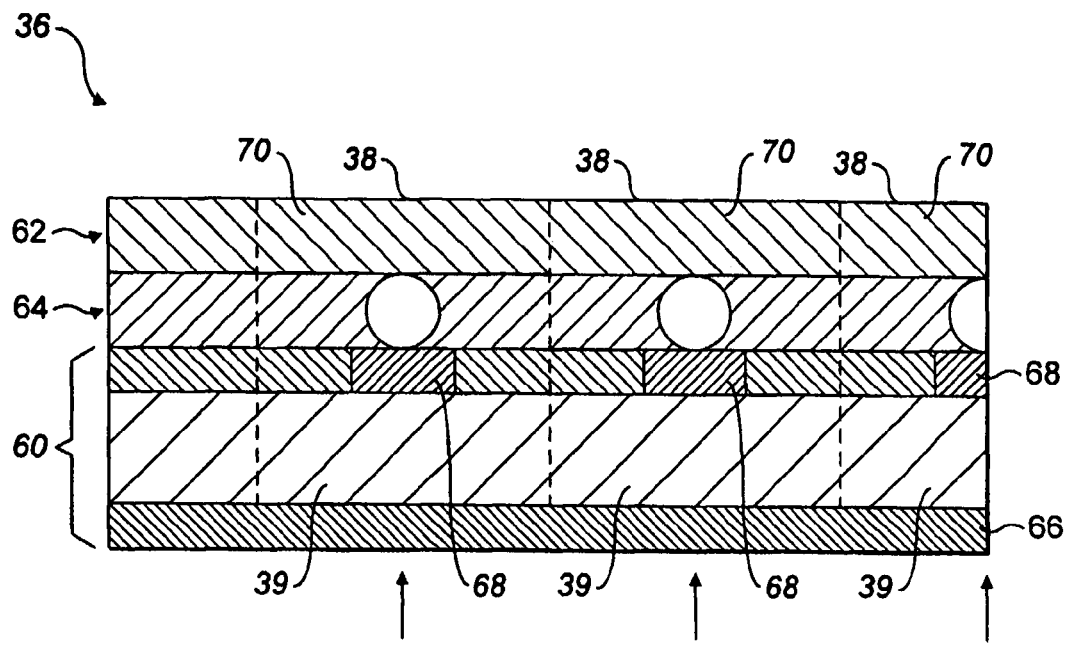
FIG. 16 is a cross section of one example of a conventional imaging device.

FIG. 16 is a schematic cross-section of part of a known imaging device 36. In this example, the imaging device 36 comprises a detector substrate 60 connected to a cell circuit substrate 62 by means of bump-bonds 64. A detector cell 39 of each image cell 38 is defined on the detector substrate 60 by a continuous electrode 66 which applies a biasing voltage and image cell location electrodes 68 to define a detection zone for the image cell 38. Corresponding active cell circuits 70 on the cell circuit substrate 62 are defined at locations corresponding to the electrodes 68 (i.e. the detector cells 39). The cell circuits 70 are electrically connected to the corresponding electrodes 68 by bump-bonds 64 which form a conductive pathway. In this manner, when charge is generated in a detector cell 39 in response to incident radiation, this charge is passed via the bump bond 64 to the corresponding cell circuit 70.

The actual size of the cell circuit and the detector cell will depend on the application for which the imaging device is intended, and will also depend on the integrated circuit technology available for constructing the cell circuit 70. With current circuit technology, it is not possible to obtain the smallest possible image detectors which would be required in some applications. Typically, the minimum image cell size is of the order of 200 square micrometres using current technology. However, with advances expected in circuit manufacturing technology, it is expected that this minimum size can be significantly reduced using the teaching of the present application and improved circuit fabrication techniques. Accordingly, the present invention is not limited to any particular image cell size.

Any appropriate semiconductor materials can be used for the substrates. For example, silicon may be used for the detector substrate and for the circuit substrate. Other semiconductor materials could be used. For example, for the detector substrate, the material could be selected from: CdZnTe, CdTe, $HgI_2$, InSb, GaAs, Ge, TiBr, Si and PbI.

Figure 17:
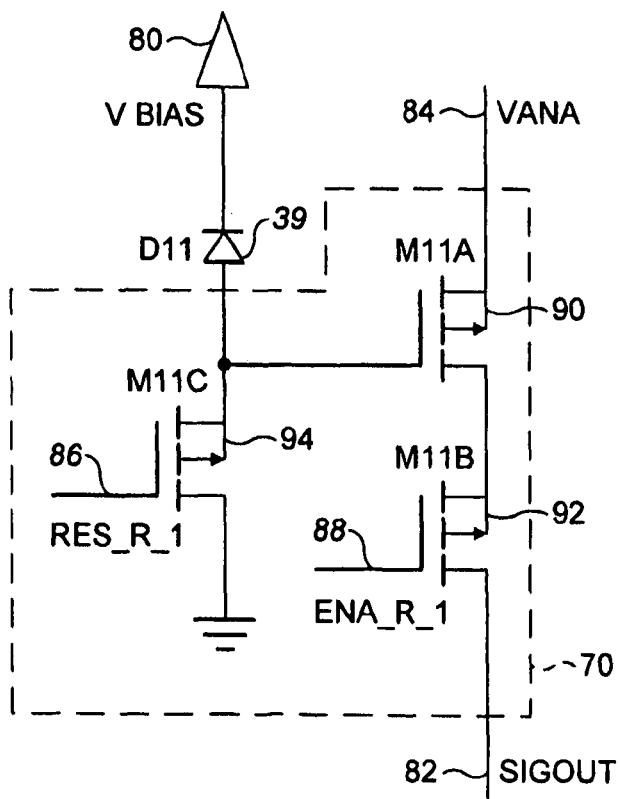
FIG. 17 is a schematic circuit diagram of an example of a conventional cell circuit.

FIG. 17 illustrates one example of a cell circuit 70 for an image cell in an example of an imaging device suitable for use in an embodiment of the invention. This example of a cell circuit uses field effect transistors (FETs) arranged as a cascode connected amplifier. VBIAS 80 is a bias voltage input across the depletion zone forming the detector cell 39 of the image cell. The detector cell 39 is represented by the diode symbol D11. In the cell circuit itself, SIGOUT 82 is an analogue signal output and VANA 84 an analogue power supply input. RES-R-1 86 is a reset input and ENA-R-1 88 is an enable input for the cell circuit. Charge is accumulated in the gate of a transistor M11A 90 when both the RES-R-1 86 and ENA-R-1 88 inputs are low.

The gate capacitance substantially forms the input node capacitance (total capacitance) thus maximising charge storage ability. In this example it is an aim of the cell circuit configuration to provide maximum charge accumulation ability by minimising the parasitic or unwanted capacitance of all other circuit (and detector) components and forming substantially all input node capacitance from the charge accumulation transistor M11A 90. Other cell circuits configurations may be optimised for fast read, and seek to reduce or optimise capacitance throughout the cell circuit to provide for such fast read out. For a 35 μm by 35 μm cell circuit the M11A 90 capacitance can be 2 pF and the FET gate voltage dynamic range can be at least 2 Volts. This corresponds to about 25,000,000 electrons in storage capacity which is more than 100 times the capacity of a CCD of the same image cell size. It should be noted that the 2 pF of the FET capacitance in the above example substantially forms all of the input mode capacitance of the image cell. In the above example of 35 by 35 μm pixels the total parasitic capacitance of the detector and the other elements in each cell circuit and corresponding detector cell is in the range of a few fF or tens of fF. For a charge accumulation circuit the capacitance of the charge storage device should be maximised and in any case be substantially bigger than the parasitic capacitance in each image cell. In the example above the capacitance of the FET acting as charge accumulating device in the cell circuit is more than 90% of the total capacitance of the image cell comprising a detector cell and the corresponding cell circuit. As a result of this, substantially all collected charge will be accumulated in the charge accumulating FET rather than being shared among the rest of the cell circuit elements. Optionally, the capacitance may be more evenly distributed throughout the cell circuit, and for fast read out applications the capacitance of the cell circuit may be significantly lower than that of circuitry optimised for charge accumulation. It will be appreciated that the use of a FET provides one example only, of a cell circuit in which example charge accumulating capacitance is maximised using a charge storage device (such as a FET gate of a capacitor) that accounts for most of the input node capacitance for each image cell.

To read the image cell, ENA-R-1 is taken to a high state, which allows current to flow from the transistor M11A 90 through the transistor M11B 92 to SIGOUT 82. The cell circuit is reset by taking RES-R-1 86 to high, whereupon after RES-R-1 has been at high for merely a few microseconds, any accumulated charge will have been removed from the gate of the transistor M11A 90. Immediately after RES-R-1 goes to a low level, charge can begin to accumulate at the gate of the transistor M11A 90. If no reset pulse is supplied to the reset input RES-R-1 86, then it is to be noted that a reading operation when the enable input ENA-R-1 goes high does not destroy the charge but instead merely causes a current flow directly proportional to the accumulated charge. This allows multiple readings without resetting.

Figure 18:
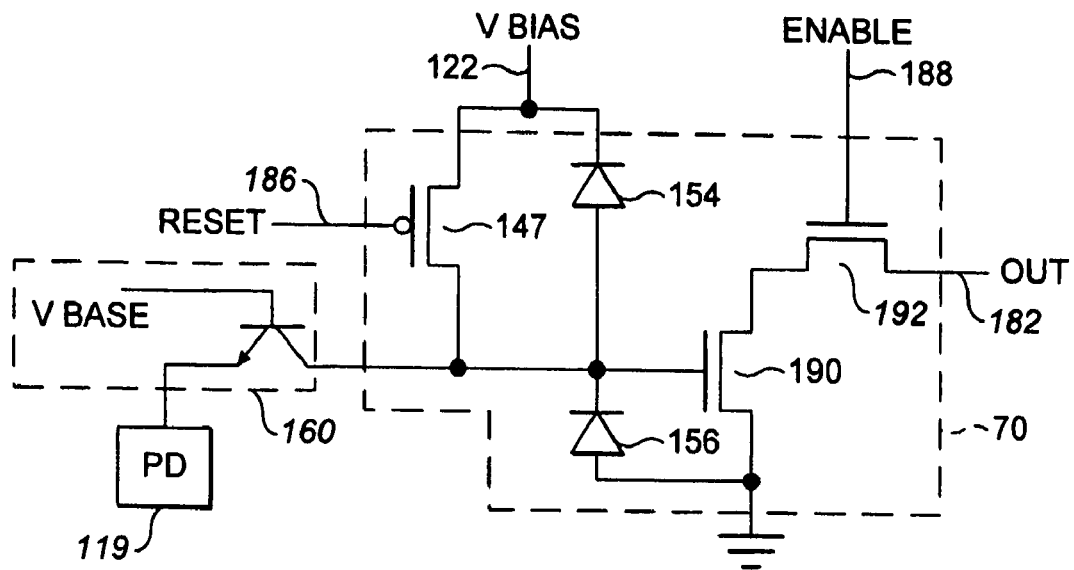
FIG. 18 is a schematic circuit diagram of a further example of a conventional detector cell circuit.

FIG. 18 illustrates a further example of cell circuit 70 for an image cell. This example is similar to the example of FIG. 17. The detector cell is represented at PD 119 of the image cell. In the cell circuit itself, VBIAS 122 is a voltage bias, OUT 182 is an analogue signal output, RESET 186 is a reset input connected to a reset FET 147 and ENABLE 188 is an enable input connected to an enable FET 192 for the cell circuit. Charge (electrons) is (are) accumulated in the gate of a charge storage FET 190 when the ENABLE 188 input is low and the RESET 186 input is high. To read the cell circuit ENABLE 188 is taken to a high state, which allows current to flow from the FET 190 through the FET 192 to OUT 192. The cell circuit is reset by taking RESET to low, whereupon after RESET 186 has been at low for merely a few microseconds, any accumulated charge will have been removed from the gate of the FET 190. Immediately after RESET 186 goes to a high level, charge can begin to accumulate at the gate of the FET 190. If no reset pulse is supplied to the rest input RESET 186, then it is to be noted that a reading operation when the enable input ENABLE goes high does not destroy the charge but instead merely causes a current flow directly proportional to the accumulated charge. It will therefore be seen that the operation of the circuit of FIG. 18 is similar to that of FIG. 17. In addition, the circuit of FIG. 18 includes diodes 154 and 156 which act as overload protection circuitry for the cell circuit. The diodes provide protection both against static electricity which might damage the FETs and against FET overload. The FET gate 190 accumulates more than a predetermined charge threshold (e.g. corresponding to 5 volts, which is the voltage bias) then current will start to flow through the diode 156 towards the ground thus protecting the FET 190. This will protect circuit cells which, for example, receive a full radiation dose outside the perimeter of an object to be imaged. Preferably the two FETs 190 and 192 are implemented as a cascode amplifier stage. In this configuration the two FETs 190 and 192 provide impedance-up conversion without increasing the noise accordingly. Consequently, the noise level from each cell circuit described in the current embodiment is only about 500 e while the cell circuit retains very small size (as small as 10-20 µm image cell size), very large dynamic range of 50,000,000 e and individual addressability.

FIG. 18 also illustrates an optional bipolar transistor 160, which may be omitted. The purpose of the bipolar transistor, with its connection to a voltage source VBASE, will be described later.

In addition to the features already described above, optional features may be included in the image cells and/or devices which can be used for isolating individual circuits in a manner to be described below.

For different detector cells the corresponding charge storing FETS 190 may accumulate different amounts of charge as a result of the different radiation or light intensities incident upon the detector cells. Consequently, a potential difference is created between adjacent image cells. If the image cells are not electrically separated this potential drop may cause signal charge to leak from one cell circuit through the detector and into the neighbouring cell circuit. The longer the accumulation time, the more severe the problem could be. In accordance with one embodiment of the invention, this effect is diminished or eliminated by providing means for electrically separating, or equivalently maximising the resistance of adjacent image cells. Accordingly, a passivation layer, for example of polyamide or of aluminium nitride (layer 389 shown in FIG. 9), is applied between detector cells (i.e. between the electrodes 68 that define the detector cell). This electrically separates adjacent detector cells since such a passivation is non-conductive. Additionally, electrodes may be applied on the passivation layer and an applied voltage V will create a barrier potential penetrating several micrometers inside the detector cell volume 39. Thus charge attempting to escape from the charge accumulating FET in a cell circuit 38 will encounter the barrier potential and will not be dissipated into the adjacent cell circuit FET.

In a further arrangement, an npn transistor (bipolar transistor 160) can be provided at the entrance of each cell circuit, as is shown in FIG. 18. When the base of the bipolar transistor is set at an appropriate voltage common to all bipolar transistors of the cell circuits (about 1V) the bipolar transistor will act as a diode allowing charge to flow into the gate of the FET 190 but at the same time prohibiting any escape along the reverse path. In this way, while maintaining different potential drops at the gates of the charge accumulating FETs 190 (proportional to the different signal charges that have been accumulated), the potential at the entry of the cell circuits is common to all cell circuits. Thus, means are provided to electrically separate image cells in the imaging device so as to retain all or substantially all charge accumulated on each cell circuit. This is particularly useful when accumulation times are rather long, for example in the range of tens or hundreds of microseconds and even more useful when accumulation times are in the range of msec or tens or hundreds of msec.

Figure 19:
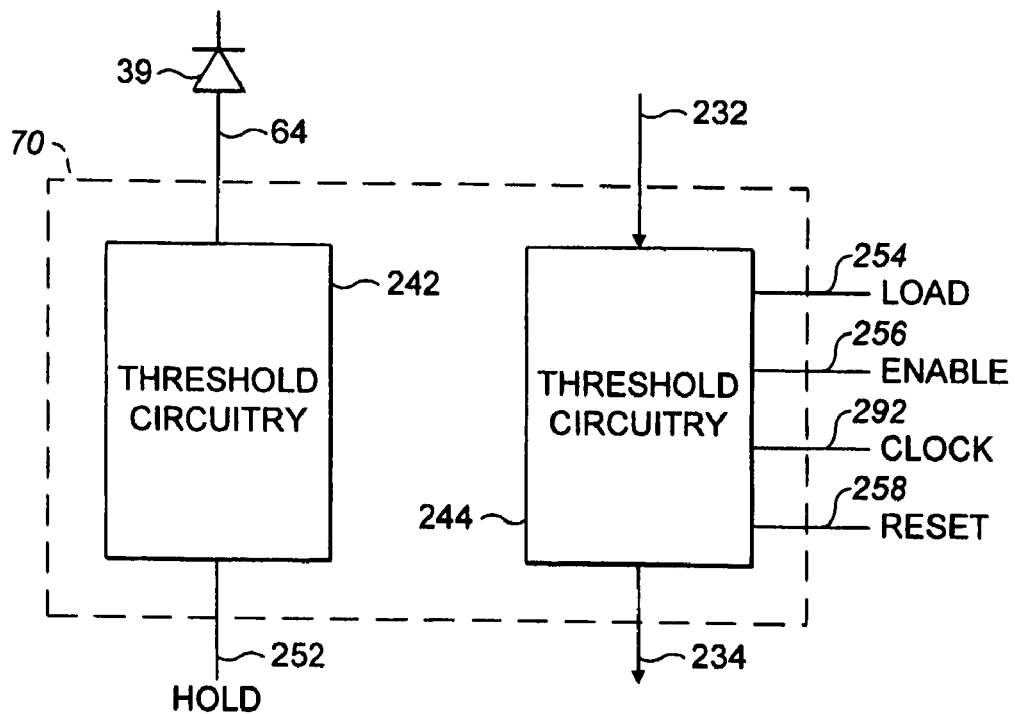
FIG. 19 is a schematic block diagram of a yet further conventional cell circuit.

FIG. 19 is a schematic diagram of another example of an individual cell circuit 70 as disclosed in International Patent Application Publication No. W098/16853, corresponding to U.S. Pat. No. 6,248,990 incorporated herein by reference. The detector cell 39 is represented by the diode in FIG. 19. The input 250 to the cell circuit 70 corresponds to the conductive path connection 64 between the detector cell 39 and the cell circuit 70 illustrated in FIG. 16.

When a photon is photo-absorbed in a detection zone of the detector cell 39 creating an electric charge, or when a charge radiation ionises a detection zone of the detector cell 39, an electric pulse flows from the detector cell 39 via the bump-bond 64 to threshold circuitry 242 of the pixel circuit 70. The threshold circuitry 242 effectively filters the input radiation intensity by comparing the input pulse peak to one or more threshold values. The output of the threshold circuitry 242 is connected to counter circuitry 244 for counting pulses (radiation hits) within one or more predetermined ranges as defined by the threshold circuitry, thereby implementing incident photon energy discrimination. The counter circuitry is connected to counter circuitry of other (typically adjacent) cell circuits for readout purposes via connections 232 and 234. Various inputs to the cell circuits 70 include hold 252, load 254, enable 256, reset 258 and clock 292 signal lines and voltage supply lines Vdd and Vss (not shown).

One or more imaging device tiles 24 may be mounted on an imaging support 8 as illustrated in FIG. 4. The imaging support 8 not only provides a mechanical support for imaging device tiles, but also circuitry and signals lines for imaging devices as will now be described.

In view of the foregoing description of particular embodiments of the invention it will be appreciated by a person skilled in the art that various additions, modifications and alternatives thereto may be envisaged. For example, the cell circuits may utilise technology other than simple CMOS technology, including but not limited to TTL, CMOS+, bipolar and BiCMOS. Furthermore, the circuit substrate material need not be silicon, but may be any other suitable semiconductor material. As will be appreciated from a reading of the foregoing descriptions of different types of image cell and cell circuitry, embodiments in accordance with the present invention may utilise many different types of image cell and cell circuitry, not limited to those described herein in detail. Other examples of cell circuitry includes, without limitation: energy discriminator circuitry; pulse shaping circuitry; pulse amplifying circuitry; analogue to digital converter circuitry; and rate divider circuitry.

Although etching of a silicon circuit substrate has been described using a $SF_6\backslash O_2\backslash HBr$ type process, other suitable processes may be used for etching silicon, and as appropriate for substrates other than silicon.

In another aspect, the present invention provides a semiconductor circuit substrate, comprising:
  circuit means supported by said circuit substrate;
  means for providing one or more conductive paths supported by said circuit substrate for supplying signals to and/or from said circuitry, said one or more conductive paths extending from said circuitry to a region of said circuit substrate; and
  means for providing one or more signal pathways extending from said region through said circuit substrate to a surface of said substrate, said one or more signal pathways electrically coupled to said one or more conductive paths to provide an external signal interface for said circuitry.

In another aspect, the present invention provides a method for fabricating a semiconductor circuit substrate, the method comprising the steps for:
  (a) etching one or more pathways through a semiconductor circuit substrate from a surface thereof at a location corresponding to a region of said circuit substrate, said one or more pathways corresponding to at least one of control signal, readout and power supply lines for supplying at least one of control signal, readout and power to a circuit in a layer of said circuit substrate; and
  (b) depositing conductive material in said one or more pathways to provide one or more conductive pathways between said at least one of control signal, readout and power supply lines and a surface of said circuit substrate.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims may be formulated to such features during the prosecution of this application or of any such further application derived therefrom. In particular, with reference to the appended claims, features from dependent claims may be combined with those of the independent claims and features from respective independent claims may be combined in any appropriate manner and not merely in the specific combinations enumerated in the claims.

The invention claimed is:

1. A method for fabricating a semiconductor circuit substrate for use in a radiation detection device, said semiconductor circuit substrate comprising cell circuitry, the method comprising the steps of:
  (a) forming one or more via holes through the semiconductor circuit substrate so as to form one or more signal pathways, each signal pathway having a first end and a second end;
  (b) depositing a conductive shielding over internal walls of said one or more via holes;
  (c) depositing an insulating layer over said conductive shielding;
  (d) depositing conductive material in said one or more signal pathways to provide one or more conductive signal pathways therein;
  (e) connecting at least one of control signal, readout and power supply lines to the first end of said signal pathways; and
  (f) connecting cell circuitry to the second end of said signal pathways.

2. A method according to claim 1, including reducing the thickness of said semiconductor circuit substrate in a region of the substrate, and forming said via holes through the region.

3. A method according to claim 2, comprising fabricating said cell circuitry in said semiconductor circuit substrate prior to reducing the thickness of said semiconductor circuit substrate.

4. A method according to claim 1, wherein step (a) comprises:
  depositing photo-resistive material over said semiconductor circuit substrate;
  applying a photo-lithographic mask having one or more openings;
  exposing said photo-resistive material through said openings in said mask;
  removing said exposed photo-resistive material to expose said circuit substrate; and
  etching said exposed semiconductor circuit substrate so as to form said one or more via holes.

5. A method according to claim 1, wherein step (d) comprises inserting conductive material into said one or more via holes.

6. A method of fabricating a radiation detector device, comprising:
  fabricating a semiconductor circuit substrate according to claim 1;
  forming a plurality of conductive contacts on a surface of said semiconductor circuit substrate, each conductive contact being arranged to receive charge from a detector cell formed in a detector substrate separate from said semiconductor circuit substrate;
  connecting said plurality of conductive contacts with cell circuitry; and
  connecting the detector substrate to said semiconductor circuit substrate by means of the conductive contacts.

7. A method for fabricating a semiconductor imaging device for imaging radiation, said semiconductor imaging device comprising a semiconductor circuit substrate comprising cell circuitry, the method comprising the steps of:
  etching an array of via holes through the semiconductor circuit substrate at locations associated with an array of detector cell circuit locations;
  depositing a conductive shielding over internal walls of said one or more via holes;
  depositing an insulating layer over said conductive shielding;
  placing a detector substrate having an array of detector cell contacts corresponding to said array of cell circuit locations in proximal relationship to the etched semiconductor circuit substrate such that detector contacts are in correspondence with said via holes; and
  depositing a conductive material in said via holes to provide signal pathways between said cell circuit locations and said detector cell contacts.

8. A method according to claim 7, comprising
  selectively applying an adhesive material to one or both of said detector substrate and said semiconductor circuit substrate; and
  coupling said detector substrate to said semiconductor circuit substrate by means of said adhesive material.

9. A method according to claim 8, in which the layer of adhesive material is selectively applied to as to leave said detector contacts substantially uncovered by said adhesive.

10. A method according to claim 9, wherein said adhesive material comprises photo-resistive material.

* * * * *